United States Patent [19]

Maeda et al.

[11] Patent Number: 4,772,496
[45] Date of Patent: Sep. 20, 1988

[54] MOLDED PRODUCT HAVING PRINTED CIRCUIT BOARD

[75] Inventors: Masahiko Maeda, Tokyo; Kenzi Fuzitani, Kanagawa; Yoshihiro Moteki, Oita, all of Japan

[73] Assignee: Showa Denko Kabushiki Kaisha, Tokyo, Japan

[21] Appl. No.: 875,034

[22] Filed: Jun. 16, 1986

[30] Foreign Application Priority Data

Jun. 15, 1985 [JP] Japan .................................. 60-129168
Jan. 24, 1986 [JP] Japan .................................. 61-12133

[51] Int. Cl.$^4$ .......................... C08L 23/08; H05K 1/03
[52] U.S. Cl. .......................................... 428/35; 156/245; 156/901; 174/68.5; 264/325; 428/209; 428/339; 428/461; 428/463; 428/901
[58] Field of Search ...................... 428/475.8, 209, 461, 428/901, 35, 339, 463

[56] References Cited

U.S. PATENT DOCUMENTS

| | | | |
|---|---|---|---|
| 4,058,647 | 11/1977 | Inoue et al. .......................... | 428/480 |
| 4,230,830 | 10/1980 | Tanny ................................. | 428/475.8 |
| 4,416,944 | 11/1983 | Adur ................................... | 428/475.8 |
| 4,423,117 | 12/1983 | Mackonis, Jr. et al. ......... | 428/475.8 |
| 4,477,532 | 10/1984 | Schmukler ....................... | 428/475.8 |

FOREIGN PATENT DOCUMENTS

| | | |
|---|---|---|
| 0148157 | 7/1985 | European Pat. Off. . |
| 0177762 | 4/1986 | European Pat. Off. . |
| 323693 | 3/1984 | Fed. Rep. of Germany . |

Primary Examiner—James C. Cannon
Attorney, Agent, or Firm—Sughrue, Mion, Zinn, Macpeak, and Seas

[57] ABSTRACT

A molded product having a printed circuit board on a thermoplastic layer is disclosed, the printed circuit board comprising a conductive metal layer and a thin-wall body containing a crosslinked product of a mixture of (A) 1 to 99 wt % of an ethylenic copolymer containing at least one monomer unit selected from the group consisting of monocarboxylic acid unit, dicarboxylic acid unit, acid anhydride unit thereof and half ester unit thereof and (B) 99 to 1 wt % of an ethylenic copolymer containing at least one monomer unit selected from the group consisting of hydroxyl unit, amino unit and oxirane unit.

19 Claims, 2 Drawing Sheets

MOLDED PRODUCT HAVING PRINTED CIRCUIT BOARD

FIELD OF THE INVENTION

This invention relates to a molded product having a printed circuit board. More particularly it relates to a molded product having a printed circuit board laminated with an ethylenic copolymer layer.

BACKGROUND OF THE INVENTION

Recently, electronic equipment has been rapidly developed to be more compact, more lightweight, and more densely mounted. Especially, printed circuit board has been commercialized for use in domestic electric machine such as radio, video camera, etc. Due to their ability to be mass-produced and their high reliability, they are presently undergoing expanded use in industrial equipment such as telephone, computor, printer, etc.

Heretofore it has been practiced that in order to mount a dense circuit three-dimensionally in narrow spaces, the printed circuit board has been either bolted or bonded with an adhesive to the interior of a molded product like a case. In such a process, however, it is difficult to make the molded product compact, and moreover, troubles often occur, such as peeling off due to vibration, etc. or contacting with neighboring wiring or the like. Further, when a conventional thermosetting substrate was bonded to a molded product, it is very liable to peel off because of the difference in the thermal expansion between the substrate and the molded product. Furthermore, as the electronic equipment is made more compact it is more difficult to mount a printed circuit board by bolting or using an adhesive, resulting in poor operability.

SUMMARY OF THE INVENTION

Therefore, an object of this invention is to provide a molded product having a printed circuit board, which is not only free from the above defects but also has an excellent heat resistance and which can be made compact and lightweight.

A molded product comprising a layer of thermoplastic resin or a composition thereof (hereinafter referred to as "resin layer") having laminated thereon a printed circuit board which comprises a conductive metal layer and a thin-wall body having a thickness of 3 μm to 5 mm and containing a crosslinked product of a mixture of (A) 1 to 99 wt % of an ethylenic copolymer which is comprised of 30 to 99.5 wt % of ethylene unit, and at least one monomer unit selected from the group consisting of monocarboxylic acid unit, dicarboxylic acid unit, acid anhydride unit thereof and half ester unit thereof (hereinafter referred to as "ethylenic copolymer (A)"); and (B) 99 to 1 wt % of an ethylenic copolymer which is comprised of 30 to 99.5 wt % of ethylene unit, and at least one monomer unit selected from the group consisting of hydroxyl unit, amino unit and oxirane unit (hereinafter referred to as "ethylenic copolymer (B)"); and optionally interposing either ethylenic copolymer (A) or ethylenic copolymer (B) between the resin layer and the printed circuit board.

DETAILED DESCRIPTION OF THE INVENTION

Figure 1:
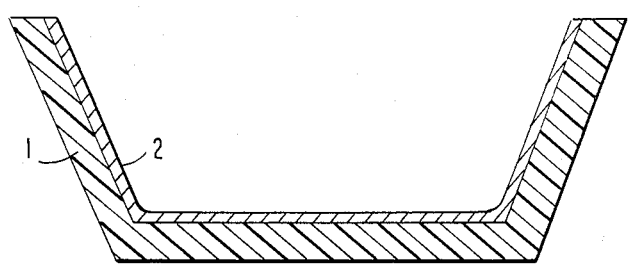
FIG. 1 shows a cross-sectional view of a molded product having a printed circuit board of this invention.

This invention will be explained in more detail below.

(A) Ethylenic copolymer (A)

The ethylenic copolymer (A) used in this inveniton is an ethylenic copolymer which is comprised of 30 to 99.5 wt % of ethylene unit, and at least one monomer unit selected from the group consisting of monocarboxylic acid unit, dicarboxylic acid unit, acid anhydride unit thereof, and half ester unit thereof (hereinafter referred to as "the monomer unit (a)").

This ethylenic copolymer (A) includes a copolymer which can be obtained by copolymerizing ethylene with the following monomers for making up the monomer unit (a), or the copolymer further containing other monomers, or the products which can be obtained by hydrolysis or alcohol modification of the acid anhydride group in these copolymers.

Examples of the monomer for making up the monomer unit (a) (hereafter referred to as "monomer (a)") include unsaturated monocarboxylic acids containing up to 25 carbon atoms, preferably 3 to 10 carbon atoms, as acrylic acid, methacrylic acid, and crotonic acid; unsaturated dicarboxylic acids containing 4 to 50 carbon atoms, preferably 4 to 30 carbon atoms, more preferably 4 to 20 carbon atoms, such as maleic acid, fumaric acid, tetrahydrophthalic acid, itaconic acid, citraconic acid, 4-methylcyclohexane-4-en-1,2-dicarboxylic acid, and bicyclo(2,2,1)hepta-5-en-2,3-dicarboxylic acid, and anhydrides of these unsaturated dicarboxylic acids.

Also, as the "other monomers" there may be mentioned unsaturated carboxylic acid esters containing up to 30 carbon atoms, preferably up to 20 carbon atoms, more preferably up to 12 carbon atoms, such as methyl (meth)acrylate, ethyl (meth)acrylate, alkoxyalkyl (meth)acrylate, n-butyl (meth)acrylate, n-hexyl (meth)acrylate, n-octyl (meth)acrylate, and 2-ethylhexyl (meth)acrylate; and vinyl esters containing up to 30 carbon atoms, preferably up to 20 carbon atoms, more preferably up to 12 carbon atoms, such as vinyl acetate, vinyl propionate, and isopropenyl acetate.

Of the ethylenic copolymer (A), the copolymers of ethylene and an unsaturated dicarboxylic acid anhydride and the copolymers of the above monomers and an unsaturated carboxylic acid ester and/or a vinyl ester may be subjected to hydrolysis and/or alcohol modification to partially or wholly convert the dicarboxylic acid anhydride unit in these copolymers into dicarboxylic acid unit or half ester unit.

The hydrolysis can be carried to by reacting the ethylenic copolymer (A) with water generally at a temperature of 80° to 100° C. for 0.5 to 10 hours (preferably 2 to 6 hours, more preferably 3 to 6 hours) in the presence of a catalyst such as a tertiary amine (e.g., triethylamine) in an organic solvent which can dissolve the copolymer, and neutralizing the resulting solution with an acid.

The alcohol modification can be carried out according to the solution process or kneading process described below.

The solution process is a process wherein the ethylenic copolymer (A) is reacted with an alcohol in the presence or absence (in which case the reaction is slow) of the above described catalyst at a reflux temperature of the alcohol generally for 2 minutes to 5 hours (preferably 2 minutes to 2 hours, more preferably 15 minutes to 1 hour) in an organic solvent as in the case of the hydrolysis.

On the other hand, the kneading process is a process wherein the ethylenic copolymer (A) is allowed to react by kneading with about 0.01 to 1.0 part by weight (preferably 0.05 to 0.5 part by weight) on the basis of 100 parts by weight of the copolymer (A) of a tertiary amine and about 0.1 to 3.0 moles (preferably 1.0 to 2.0 moles) of an alcohol per mole of dicarboxylic acid anhydride unit in the copolymer (A) at a temperature higher than the melting point of the copolymer (A) but lower than the boiling point of the alcohol used, for several minutes to several tens minutes (preferably 10 minutes to 30 minutes) by means of a kneading machine such as Banbury mixer, extruder, etc. that are commonly used in the fields of rubber, synthetic resin, etc.

Examples of the alcohol used in the above described alcohol modification include straight chain or branched chain alcohols containing preferably 1 to 12 carbon atoms such as methyl alcohol, ethyl alcohol, and primary butyl alcohol.

In the case of the hydrolysis as well as the alcohol modification, the % conversion to dicarboxylic acid and the % esterification to half ester is both preferably 0.5 to 100%, and more preferably 10.0 to 100%.

The content of the ethylene unit in the ethylenic copolymer (A) is 30 to 99.5 wt %, preferably 30 to 99.0 wt %, and more preferably 35 to 99.0 wt %. The total content of the monomer unit (a) (i.e., the monocarboxylic acid unit, the dicarboxylic acid unit, the acid anhydride unit and the half ester unit) in the copolymer is 0.1 to 70 wt %, preferably 0.5 to 70 wt %, more preferably 0.5 to 60 wt %, and most preferably 0.5 to 40 wt %. If the content of the monomer unit (a) is less than 0.1 wt %, when crosslinked with the ethylenic copolymer (B) by heating, not only does the crosslinking become incomplete, but also the adhesion to the metal layer becomes insufficient. Whereas, even if the content exceeds 70 wt %, the characteristic features of this invention may be manifested, but it is not preferred from the economically standpoints.

Further, when copolymer further containing an unsaturated carboxylic acid ester and/or a vinyl ester as a comonomer component is used, the total content of these esters in the copolymer is up to 69.9 wt %, preferably less than 60 wt %, and more preferably less than 50 wt %.

If the content exceeds 69.9 wt %, the softening point of the copolymer (A) rises, so that the fluidity is deteriorated below 150° C., and further it is not economical.

(B) Ethylenic copolymer (B)

The ethylenic copolymer (B) used in this invention is an ethylenic copolymer which is comprised of 30 to 99.5 wt % of ethylene unit, and at least one monomer unit selected from the group consisting of hydroxyl unit, amino unit, and oxirane unit (hereinafter referred to as "the monomer unit (b)"). Of the monomer unit (b), oxirane unit is particularly preferred because the resulting thin-wall body exhibits excellent adhesion with the metal layer.

The ethylenic copolymer (B) includes a copolymer which can be obtained by copolymerizing ethylene with the following monomers for making up the monomer unit (b), the copolymer further containing other monomers, and saponification products of a copolymer of ethylene and vinyl ester (especially vinyl acetate).

Examples of the monomer for making up the monomer unit (b) (hereinafter referred to as "monomer (b)") include hydroxyalkyl (meth)acrylates having the alkyl moiety of up to 30 carbon atoms and preferably 1 to 25 carbon atoms, α-alkenylalcohols having up to 30 carbon atoms and preferably 3 to 2 carbon atoms, α-alkenylamines having up to 30 carbon atoms and preferably 2 to 25 carbon atoms, primary or secondary aminoalkyl (meth)acrylates having the alkyl moiety of up to 30 carbon atoms and preferably 1 to 25 carbon atoms, and compounds having an oxirane ring represented by the following general formulae (I) to (III):

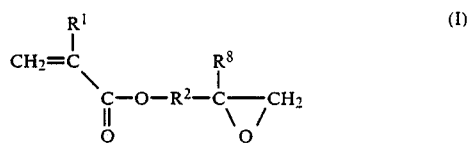

(I)

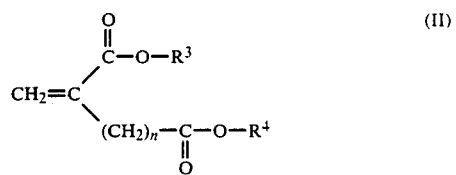

(II)

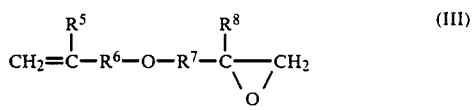

(III)

wherein $R^1$, $R^5$ and $R^8$ which may be the same or different, each represents a hydrogen atom or a methyl group; $R^2$, $R^6$ and $R^7$ which may also be the same or different, each represents a straight chain or branched chain alkylene group having 1 to 12 carbon atoms; $R^3$ and $R^4$ each represents a straight chain or branched chain alkyl group having up to 12 carbon atoms and a straight chain or branched chain alkyl group having 2 to 12 carbon atoms and having an oxirane group at the terminal, provided that at least one of $R^3$ and $R^4$ has the alkyl group having an oxirane group; and n is 0 or 1.

Examples of the monomer (b) include butenecarboxylic acid monoglycidyl ester, glycidyl methacrylate, glycidyl acrylate, methylglycidyl acrylate, methylglycidyl methacrylate, itaconic acid glycidyl ester, 7,8-epoxy-1-octyl methacrylate, itaconic acid methylglycidyl ester, 7,8-epoxy-1-octyl vinyl ether, vinyl glycidyl ether, allyl glycidyl ether, 2-methyl-2-propenyl glycidyl ether, hydroxymethyl (meth) acrylate, hydroxyethyl (meth)acrylate, hydroxypropyl (meth)acrylate, hydroxybutyl (meth)acrylate, hydroxyhexyl (meth)acrylte, allyl alcohol, allylamine, and aminoethyl (meth)acrylate.

Also, as the "other monomers" there may be mentioned the above described unsaturated carboxylic acid ester and vinyl ester.

The content of the ethylene unit in this ethylenic copolymer (B) is 30 to 99.5 wt %, preferably 30 to 99.0 wt %, and more preferably 35 to 99.0 wt %. Also, the total content of the monomer unit (b) (i.e., the hydroxyl unit, the amino unit, and the oxirane unit) in the copolymer is 0.1 to 70 wt %, preferably 0.5 to 70 wt %, more preferably 0.5 to 60 wt %, and most preferably 0.5 to 40 wt %, for the same reason as in the case of the above described ethylenic copolymer (A). Further, when the copolymer containing the above described unsaturated carboxylic acid ester and/or vinyl ester, as a comonomer component is used, the total content of these esters is up to 69.9 wt %, and preferably less than 60 wt % for the same reason as in the case of the above described ethylenic copolymer (A).

The melt index (as defined later with respect to the thermoplastic resins) of the above described ethylenic copolymers (A) and (B) is generally 0.01 to 1000 g/10 min., preferably 0.05 to 500 g/10 min., more preferably 0.1 to 500 g/10 min., and most preferably 0.1 to 300/10 min. When those copolymers having the M.I. of less than 0.01 g/10 min. are used, not only is the homogeneous mixing of these copolymers difficult, but also the moldability of the resulting mixture is not good.

Of these ethylenic copolymers, where they are prepared by a copolymerization process, ethylene and the monomer (a) or the monomer (b), or these and other monomers are copolymerized at a temperature of 120 to 260° C. under a high pressure of usually 500 to 2500 kg/cm² in the presence of a free-radical generator (for example, organic peroxide). Such a process is well known. Also, the process wherein hydrolysis and/or alcohol modification are carried out for the preparation of the above described ethylenic copolymer (A) and the process wherein saponification is carried out for the preparation of the ethylenic copolymer (B) are also well known.

(C) Preparation of mixture (1) Mixing ratio

When preparing the mixture of this invention, the mixing ratio (by weight) of the ethylenic copolymer (A) to the ethylenic copolymer (B) is 1/99 to 99/1, preferably 5/95 to 95/5, and more preferably 10/90 to 90/10. In the case where the mixing ratio is less than 1/99 or exceeds 99/1, when the mixture is crosslinked by the later described process, the crosslinking is insufficient, so that the resulting thin-wall body does not exhibit good adhesion to the conductive metal layer as later described.

(2) Mixing method

The mixture can be obtained by homogeneously mixing the ethylenic copolymer (A) and the ethylenic copolymer (B) in accordance with, for example, the dry blending method using a mixer such as Henschel mixer in wide use in the field of olefinic polymer, or the melt kneading method using a mixer such as Banbury, extruder, or roll mill. More homogeneous mixture can be obtained by melt kneading the mixture which has been dry blended. In the melt kneading it is important that a crosslinking reaction does not substantially take place between the ethylenic copolymer (A) and the ethylenic copolymer (B). If the crosslinking occur, when the resulting mixture is processed by molding as later described, not only does the moldability become poor but also the heat resistance of the molded product is lowered. For the reason, the melt kneading temperature is from room temperature (20° C.) to 150° C., preferably below 140° C., though it varies depending on the kind and the viscosity of the ethylenic polymers used. When the melt kneading is carried out at a relatively high temperature (e.g., 100 to 150° C.), the kneading time should not be too long and it is generally 1 to 5 minutes.

As a tentative criterion of this "mixture with substantially no crosslinking reaction", residual particles larger than 0.1 micron in diameter after 3-hour extraction of the mixture in boiling toluene (hereinafter referred to as "extraction residue") is in general not more than 15 wt %, preferably not more than 10 wt %, and most preferably not more than 5 wt %.

In the preparation of this mixture, so far as the characteristics (physical properties) of the thin-wall body of this invention are not impaired, there may be added the additives widely used in the field of olefinic polymer such as stabilizers to oxygen, light (ultraviolet rays), and heat; a metal deterioration preventing agent, a flame retarder, an electrical characteristics improving agent, an antistatic agent, a lubricant, a processibility improving agent, and a viscosity improving agent. Further, by adding a crosslinking promotor such as a monoamine type compound, a polyamine type compound, an epoxy compound, p-toluenesulfonic acid, zinc chloride, magnesium acetate, an ammonium halide, and phosphoric acid, which varies depending on the kind of the ethylenic copolymers (A) and (B), the crosslinking of the ethylenic copolymers (A) and (B) in the later described heat treatment under pressure can be completed more easily. The amount of the crosslinking promotor is usually up to 5.0 parts by weight, preferably 0.005 to 3.0 parts by weight, per 100 parts by weight of the copolymers. Also, insulation property of the thin-wall body can be improved by adding an insulating ceramic such as alumina or silicon nitride. In addition to the above, by filling inorganic powdery materials, glass fiber, glass beads, etc. the function of this invention can be more enhanced.

(D) Preparation of thin-wall body

In the case where the thin-wall body of this invention is utilized in the form of film or sheet, the thin-wall body can be obtained by extruding the above described mixture into the form of film or sheet by means of the extruder, in accordance with the T-die film inflation process generally used in the field of thermoplastic resin. In the such case, the extrusion temperature is 250° C. or lower. If the extrusion is carried out at a temperature higher than 250° C., the ethylenic copolymers (A) and (B) are partially crosslinked, giving rise to small masses of gel-like material, so that it is not possible to obtain a homogeneous extrusion molding. Therefore, the extrusion temperature should be in the same range as in the case of the melt kneading irrespectively of whether the crosslinking promotor has been added or not.

The thin-wall bodies thus prepared are quenched in a water tank or using a water-cooled roll in order to prevent the thin-wall bodies from adhering to each other or to a take-up roll, whereby highly transparent thin-wall bodies can be obtained. The thickness of the thin-wall body is generally 5 to 400 microns and preferably 10 to 200 microns.

(E) Heat treatment under pressure

Since in the thin-wall body thus obtained crosslinking has scarcely proceeded, it shows almost the same behavior as that of the ordinary thin-wall bodies. It is important that in order to impart the heat resistance the thin-wall body is heat-treated under pressure at a temperature of 100° to 400° C. While the temperature varies depending on the kind and the content of the reactive groups in the ethylenic copolymers (A) and (B) and the presence or absence of a crosslinking promotor. For instance, the thinwall body is generally heat-treated under pressure for 10 to 20 minutes when the heating temperature is in the range of 100° to 160° C.; for 1 to 10 minutes at 160° to 240° C.; and for less than 5 minutes at 240 to 400° C.; whereby the crosslinking reaction (condensation reaction) takes place and the heat resistance is remarkably increased.

The thus crosslinked thin-wall body generally has the extraction residue of 60% or more, preferably 70% or more, and more preferably 75% or more.

Figure 8:
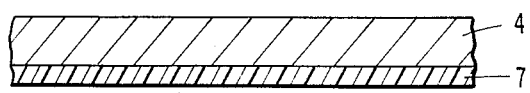
FIGS. 8 and 9 show a partially enlarged crosssectional view of the printed circuit boards of this invention before and after formation of a circuit, respectively, which have an adhesive layer of either ethylenic copolymer (A) or ethylenic copolymer (B).
Figure 9:
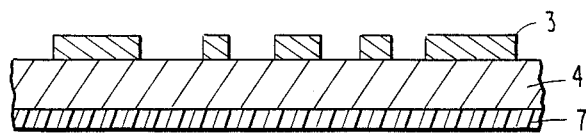

It is preferred to laminate, as shown in FIGS. 8 and 9, either the ethylenic copolymer (A) or the ethylenic copolymer (B) on the surface of the crosslinked thin-wall body, because the thin-wall body thus laminated exhibits excellent adhesiveness when heat-treated under pressure. FIGS. 8 and 9 show a partially enlarged cross sectional view of the representative printed circuit boards of this invention before and after formation of a circuit. In these figures, 4 is the crosslinked thin-wall body, and 7 is an adhesive layer of ethylenic copolymer (A) or (B). The ethylenic copolymer (A) or (B) can be laminated on the surface of the crosslinked thin-wall body according to a lamination process commonly practiced in the field of general thermoplastic resin such as extrusion (T-die) molding process, roll lamination process, press lamination process, etc. That is to say, molten ethylenic copolymer (A) or (B) is laminated on the surface of the crosslinked thin-wall bodies. The thinner is the ethylenic copolymer (A) or (B) layer, the more the heat resistance and the humidity resistance are improved. The thickness is generally 1 to 100 microns, preferably 2 to 50 microns, and more preferably 3 to 30 microns. Even when the thickness is less than 1 micron, the effect of this invention can be manifested, but as it is difficult to achieve steady production of such a thin layer as long as a common molding machine is used. On the other hand, when the thickness exceeds 100 microns, the reactive groups of the ethylenic copolymer (A) or (B) remain unreacted in an increased proportion when heat-treated under pressure, so that although good adhesion is obtained, it is undesirable in that the thin-wall body thus obtained have portions poor in heat resistance.

The molded product of this invention can be prepared in such a manner that after the crosslinked or non-crosslinked thin-wall body (with or without the adhesive layer) containing the ethylenic copolymer (A) and the ethylenic copolymer (B) as the main components, or a laminated material obtained by laminating the thin-wall body and various materials as later described (other than the thermoplastic resin or a composition thereof and the conductive metal layer) is inserted into the mold, the later described thermoplastic resin or a composition thereof is molded according to the molding process which is widely employed in the field of synthetic resin, such as injection molding process, compression (stamping) molding process, thermoforming process (for example, vacuum forming, pressure forming), hollow molding process, and lamination molding process.

(F) Thermoplastic resin

Typical examples of the thermoplastic resins are shown below.

Olefin polymers; polyamide resins; polycarbonate resins; styrene polymers; graft polymers resulting from graft polymerization of styrene and at least one other vinyl compound to chlorinated polyethylene or a mixture of chlorinated polyethylene and a copolymer of styrene and at least one other vinyl compound (hereinafter referred to as "impact resistant resins (A)"); impact resistant resins prepared by graft copolymerization of at least one vinyl compound selected from the group consisting of styrene, acrylonitrile, and methyl methacrylate to at least one rubber selected from the group consisting of butadiene rubber, acrylate rubber and ethylene/propylene rubber (these impact resistant resins are hereinafter referred to as "impact resistant resins (B)"); phenylene oxide polymers, aromatic polyesters, oxymethylene polymers and vinyl chloride polymers.

These thermoplastic resins are mass produced industrially and widely used in various fields. They are described below in detail.

(1) Olefin Polymers

Olefin polymers which are used as the thermoplastic resins of the present invention include an ethylene homopolymer, polymer, a propylene homopolymer, an ethylene/propylene copolymer, and copolymers of ethylene and/or propylene and other α-olefins having 12 or less carbon atoms (the proportion of the α-olefin is generally 20% by weight or less). The melt index (as determined according to ASTM D-1238 at a temperature of 190° C. under a load of 2.16 kg) or melt flow index (as determined according to ASTM D-1238 at a temperature of 230° C. under a load of 2.16 kg) of the olefin polymer is preferably from 0.01 to 100 g/10 min. and more preferably from 0.02 to 80 g/10 min. If M.I. or MFI is less than 0.01 g/10 min., the resulting mixture is poor in moldability. On the other hand, if an olefin polymer having an M.I. or MFI of more than 100 g/10 min. is used, the ultimate mold has poor mechanical properties. An ethylene homopolymer, copolymers of ethylene and a small amount of α-olefins as described above, a propylene homopolymer, and random or block copolymers of porpylene, ethylene and/or other α-olefins are desirable.

These olefin polymers are produced by homo- or copolymerizing olefins by the use of a catalyst system comprising a transition metal compound and an organoaluminum compound (a so-called Ziegler catalyst), a catalyst comprising a support (e.g., silica) and a chromium-containing compound (e.g., chromium oxide) deposited on the support (a so-called Phillips catalyst), or a radical initiator (e.g., organic peroxides).

In addition, modified polyolefins prepared by graft polymerization of compounds containing at least one double bond (e.g., unsaturated carboxylic acids, monobasic carboxylic acids, and vinylsilane compounds) to the above olefin polymers can be used.

Methods of production of these olefin resins and modified polyolefins are well known.

These olefin polymers and modified polyolefins can be used singly or in combination with each other. Resin blends prepared by blending two or more of the olefin polymers and modified polyolefins in any desired ratio can also be used.

(2) Polyamide Resins

Polyamide resins which can be used as the thermoplastic resin are generally called nylon, in which the main chain is composed of repeating amido group (—CONH—). These polyamide resins are generally prepared as follows:

(1) Ring opening of lactam

   (IV)

(2) Condensation of amino acid

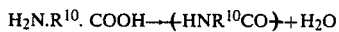   (V)

(3) Condensation of diamine and dicarboxylic acid

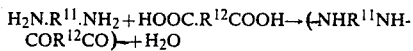   (VI)

In the above formulae (IV) to (VI), $R^9$ is an alkylene group containing from 5 to 11 carbon atoms, $R^{10}$ is an alkylene group containing from 5 to 16 carbon atoms, $R^{11}$ is an alkylene group containing from 2 to 11 carbon atoms, and $R^{12}$ is an alkylene group containing from 3 to 40 carbon atoms.

Typical examples of the polyamide resins include:
nylon 6 as prepared by ring opening polymerization of ε-caprolactam;
similar polyamide resins as prepared by ring opening polymerization of γ-butyrolactom, δ-valerolactam, ε-enantholactam, or η-capryllactam;
nylon 12 as prepared by ring opening polymerization of ω-laurolactam;
nylon 11 as prepared by heat condensation of 11aminoundecanic acid;
nylon 66 as prepared by polycondensation of hexamethylenediamine and adipic acid; and
nylon 6,10 as prepared by polycondensation of hexamethylenediamine and sebacic acid. In addition, N-alkoxymethyl-modified nylon (type 8 nylon), transparent nylon trimethylhexamethylenediamine/terephthalic acid condensates, nylon 9, nylon 13, Q2 nylon, and the like can be used.

For these polyamide resins, the molecular weight is usually at least 10,000, preferably from 15,000 to 50,000, and more preferably from 15,000 to 30,000. The degree of polymerization is usually at least 100, preferably from 150 to 500, and more preferably from 150 to 300.

These polyamide resins are commercially produced and widely used in a wide variety of applications. Their process of production, characteristics, and so forth are described in detail, for example, in O. Fukomoto, etc., *Plastic Zairyo Koza* (Plastic Materials), No. 16, "Polyamide Resins", Nikkan Kogyo Shinbun Sha, Tokyo (1970) and "Encyclopedia", Vol. 10, pp. 483-597 (1969). Of these polyamide resins, polyamide resins having a viscosity (at 260° C.) of from 500 to 50,000 poises are preferred, with those having a viscosity (at 260° C.) of from 500 to 3,000 poises being particularly preferred.

(3) Polycarbonate Resins

Polycarbonate resins which can be used as the thermoplastic resin can usually be prepared by the following four methods:

(1) Ester exchange reaction between carbonic acid diesters derived from monofunctional aromatic or aliphatic hydroxy compounds and hydroxy compounds (hereinafter referred to as "Method (1)");

(2) Ester exchange reaction of dihydroxy compounds themselves or between dihydroxy compounds and bisalkyl or bisaryl carbonate of other dihydroxy compounds (hereinafter referred to as "Method (2)");

(3) Reaction of dihydroxy compounds and phosgene in the presence of an acid coupling agent (hereinafter referred to as "Method (3)"); and (4) Reaction of dihydroxy compounds and bischlorocarbonic acid esters of dihydroxy compounds in the presence of an acid coupling agent (hereinafter referred to as "Method (4)").

Of the above-described methods, Methods (1) and (3) are industrially employed.

Method (1) is called a melting method, in which bisphenol A and diphenyl carbonate are reacted at elevated temperatures and under reduced pressure in an inert gas atmosphere in the absence or presence of an ester exchange catalyst. Ester exchange catalysts which can be used include various metals, metal alcoholates, oxides, carbonic acid salts, acetic acid salts, hydrides, organic acid alkali salts, and alkaline earth metal amides.

Method (3) is called a solvent method, in which bisphenol A and phosgene are reacted at room temperature in a solvent in the presence of an acid coupling agent (e.g., caustic alkali and pyridine).

The molecular weight of the polycarbonate resin as produced by Method (1) by usually from 5,000 to 50,000 and more usually from 10,000 to 30,000. The molecular weight of the polycarbonate resin as produced by Method (3) is usually from 10,000 to 200,000 and more usually from 20,000 to 150,000.

These polycarbonate resins are commercially produced and widely used in various applications. Their process of production, characteristics, and so forth are described in detail, for example, in Tachikawa and Sakajiri, ed., *Plastic Zairyo Koza* (*Plastic Materials*), No. 17, "Polycarbonates", Nikkan Kogyo Shinbun Sha, Tokyo (1971) and "Encyclopedia", Vol. 10, p. 710.

(4) Styrene Polymers

Styrene polymers which are used as the thermoplastic resins of the present invention include a styrene homopolymer (generally having a molecular weight of from 50,000 to 300,000), copolymers made mainly (at least 60% by weight) of styrene (i.e., copolymers of at least 60% by weight of styrene and other monomers, i.e., organic compounds containing a double bond), and impact resistant resins as described hereinafter. Typical examples of the above organic compounds containing a double bond are ethylene, vinyl acetate, maleic anhydride, acrylonitrile, and methyl methacrylate. Methods of production of these styrene polymers are well known. Impact resistant resins are produced by graft copolymerization of styrene onto butadiene rubber and styrene/butadiene rubber. This styrene/butadiene rubber is a copolymer rubber comprising at least 60% by weight of butadiene and styrene. It may be a random copolymer rubber or a block copolymer rubber. For these butadiene rubber and styrene/butadiene rubber, the Mooney viscosity is usually from 20 to 140, with the range of from 20 to 120 being particularly preferred. The graft copolymerization method includes a bulk polymerization method, a solution polymerization method, an emulsion polymerization method, and an aqueous suspension polymerization method, and a combination of the above method and a graft polymerization method (for example, a method comprising conducting bulk polymerization and then aqueous suspension polymerization). The total amount of the butadiene rubber and the styrene/butadiene rubber added to produce 100 parts by weight of the impact resistant resin is from 1 to 30 parts by weight, preferably from 1 to 25 parts by weight, and particularly preferably from 2 to 20 parts by weight. (In addition, a method may be employed in which a relatively large amount of the above rubber is used to produce a graft polymer containing a large amount of the rubber-like material, and the above styrene polymer and/or copolymer of styrene and other monomer is added to and mixed with the graft polymer. In this case, the amount of the rubber used is calculated based on the amount of the mixture.) The molecular weight of the monomer chain grafted to the rubber is usually from 1,000 to 300,000 and preferably from 2,000 to 250,000. In general, in this graft polymerization, it rarely occurs that the monomer is completely bound to the rubber. That is, a grafted material, rubber, and homopolymers of the monomer which is not linked to the rubber are present in combination. This mixture is used as such without separation of any of the grafted material, rubber and homopolymers of the monomer.

These styrene polymers are industrially produced and widely used in various fields. Their methods of production and, properties are well known.

(5) Impact Resistant Resins (A)

The impact resistant resin (A) which is used as the thermoplastic resin of the present invention contains from 5 to 40% by weight, preferably from 10 to 40% by weight, more preferably from 15 to 35% by weight, (as a total amount) of chlorinated polyethylene and a chlorinated polyethylene produced by graft polymerization of styrene and at least one other vinyl compound to chlorinated polyethylene. The impact resistant resin (A) may further contain a copolymer of styrene and at least one other vinyl compound.

The impact resistant resin (A) of the present invention is a composition prepared by mixing chlorinated polyethylene and the above styrene/vinyl compound copolymer, a graft copolymer prepared by graft polymerization of styrene and at least one other vinyl compound to chlorinated polyethylene, or a composition prepared by mixing a graft copolymer obtained by graft copolymerization of small amounts of styrene and at least one other vinyl compound to chlorinated polyethylene and the above styrene/vinyl compound copolymer. In a case that, of the impact resistant resins of the present invention, the composition is used, a composition may be used which has been prepared by mixing constituents in advance. Alternatively, they may be mixed in producing the ultimate composition of the present invention. Even if any of the above composition and graft copolymer is used as the impact resistant resin (A) of the present invention, it is important that the proportion of the non-grafted and grafted chlorinated polyethylenes in the ultimate composition is within the above-described range.

Chlorinated polyethylene to be used in the preparation of the impact resistant resin (A) can be produced by chlorinating powdered polyethylene or polyethylene particles in an aqueous suspension, or by chlorinated polyethylene dissolved in organic solvents. Chlorinated polyethylene produced by chlorinating polyethylene in an aqueous suspension is desirable. In general, amorphous or crystalline chlorinated polyethylene having a chlorine content of from 20 to 50% by weight is used. Particularly preferred is amorphous chlorinated polyethylene having a chlorine content of from 25 to 45% by weight.

The above polyethylene is an ethylene homopolymer or a copolymer of ethylene and 10% by weight or less of - olefin (usually having 6 or less carbon atoms). In general, the density if from 0.910 to 0.970 g/cc, and the molecular weight is from 50,000 to 700,000.

Representative examples of the impact resistant resins are a grafted material prepared by graft copolymerization of styrene and acrylonitrile onto chlorinated polyethylene, a grafted material prepared by graft copolymerization of styrene and methyl methacrylate onto chlorinated polyethylene, a blended material of chlorinated polyethylene and a styrene/acrylonitrile copolymer, and a blended material of chlorinated polyethylene and an acryl resin. The acryl resin includes polymers made mainly of acrylates or methacrylates. Typical examples are polymers made mainly of methyl acrylate, butyl acrylate and/or methyl methacrylate.

(6) Impact Resistant Resin (B)

The impact resistant resin (B) which is used as the thermoplastic resin of the present invention is prepared by graft copolymerization of at least one vinyl compound selected from the group consisting of styrene, acrylonitrile and methyl methacrylate onto at least one rubber selected from the group consisting of butadiene rubber, acrylate rubber, and ethylene/propylene rubber, as described in "Encyclopedia", Vol. 1, pp. 374–444 (1964).

(a) Butadiene Rubber

The butadiene rubber is a rubber made mainly (at least 60% by weight) of butadiene, including a butadiene homopolymer rubber and a copolymer rubber of butadiene and a small amount of styrene or acrylonitrile (SBR and NBR). The butadiene/styrene copolymer rubber may be a block copolymer rubber or a random copolymer rubber.

(b) Acrylate Rubber

The acrylate rubber is produced by emulsion polymerizing an acrylic acid ester (e.g., butyl acrylate) with a small amount (generally 10% by weight or less) of other monomer (e.g., acrylonitrile). It is usually called an acryl rubber.

(c) Ethylene/Propylene Rubber (EPR)

The ethylene/propylene rubber includes an ethylene/propylene copolymer rubber produced by copolymerization of ethylene and propylene, and a copolymer produced by copolymerizing ethylene and propylene (major constituents), and a small amount (usually 10% by weight or less) of a monomer such as a straight or branched diolefin containing two double bonds at the terminals (e.g., 1,4-pentadiene, 1,5-hexadiene, and 3,3-dimethyl-1,5-hexadiene) or a straight or branched diolefin containing one double bond at the terminal (e.g., 1,4-hexadiene and 6-methyl-1,5-heptadiene), or a ring-like diene hydrocarbon (e.g., bicyclo(2,2,1)-heptene-2 and its derivative). In these polymers, it is preferred that the weight ratio of the ethylene monomer unit to the propylene monomer unit be from 30/70 to 70/30. The ethylene/propylene rubbers are produced by copolymerizing ethylene and propylene, or ethylene, propylene and the above monomer in the presence of a catalyst system comprising transition metal compounds are organoaluminum compounds.

In producing the impact resistant resins of the present invention, the rubber-like material preferably has a Mooney viscosity of from 20 to 140, with the range of from 30 to 120 being particularly preferred, although it varies depending on the type of the rubber-like material. These rubber-like materials are produced industrially and used widely in various fields. Their methods of production, propeties, and uses are well known (see, for example, S. Kanbara, *Gosei Gomu Handbook (Synthetic Rubber Handbook)*, Asakura Shoten (1967)).

(d) Preparation of Impact Resistant Resin (B)

The impact resistant resin (B) is produced by graft polymerization of at least one of styrene and other vinyl compounds (e.g., acrylonitrile and methyl methacrylate) onto the above rubber-like material. The graft polymerization method includes a bulk polymerization method, a solution polymerization method, an emulsion polymerization method, and an aqueous suspension polymerization method, and a combination of the above polymerization method (e.g., a method in which bulk polymerization is first carried out and then aqueous suspension polymerization is carried out). In general, in producing 100 parts by weight of the impact resistant resin (B), the rubber-like material is used in an amount of from 3 to 40 parts by weight, preferably from 5 to 35 parts by weight, and particularly preferably from 5 to 30 parts by weight. (In addition, a method may be employed in which a large amount of the rubber-like material is used to produce a graft polymer containing a large amount of the rubber-like material, and the above-described homo- or copolymer of styrene, acrylonitrile, and methyl methacrylate is added to the graft polymer. In this case, the amount of the rubber-like material is calculated based on the amount of the mixture.) The molecular weight of the graft chain (or styrene, acrylonitrile, and methyl methacrylate) linked to the rubber-like material is usually from 1,000 to 300,000 and preferably from 2,000 to 200,000. In this graft polymerization, it rarely occurs that the monomer is completely linked to the rubber-like material. Thus, the grafted material and homo- and copolymers of the monomer not linked to the rubber are present in combination. This mixture is used as such without separation of the homo- and copolymers.

(e) Typical Examples of Impact Resistant Resin (B)

Typical examples of the impact resistant resins (B) are shown below.

An acrylonitrile/butadiene/styrene terpolymer (ABS resin) obtained by graft copolymerization of styrene and acrylonitrile onto a butadiene homopolymer rubber, a styrene/butadiene block or random copolymer rubber (SBR), or an acrlonitrile/butadiene copolymer rubber (NBR); a methyl methacrylate/butadiene/styrene terpolymer resin (MBS resin) obtained by graft copolymerization of styrene and methyl methacrylate onto the butadiene homopolymer rubber or SBR; an acrylonitrile/acrylate/styrene terpolymer resin (AAS resin) obtained by graft copolymerization of acrylonitrile and styrene onto the acrylate rubber; and a graft copolymer resin (AES resin) obtained by graft copolymerization of acrylonitrile and styrene onto the ethylene/propylene rubber.

(7) Phenylene Oxide Polymers

The phenylene oxide polymer which is used as the thermoplastic resin of the present invention is at least one thermoplastic resin selected from the group consisting of phenylene oxide-containing condensates and polymers obtained by graft polymerization of vinyl compound (styrene or a mixture of styrene and other vinyl compound such as acrylonitrile and methyl methacrylate) onto phenylene oxidecontaining condensates. The phenylene oxide polymer composition may further contain polymers obtained by graft polymerization of the vinyl compound onto the above-described rubber-like materials (i.e., butadiene rubbers, acrylate rubbers, ethylene/propylene rubbers, and chlorinated polyethylene rubbers), and/or the above-described styrene-containing polymers (styrene polymers). The total proportion of the phenylene oxide-containing condensate and the grafted phenylene oxide-containing condensate in the composition is at least 5.0% by weight, preferably at least 7.0% by weight, and particularly preferably at least 10% by weight.

(a) Phenylene Oxide-Containing Condensates

The phenylene oxide-containing condensate is polyphenylene ether (hereinafter abbreviated to "PPO"), which can be represented by formula (VII):

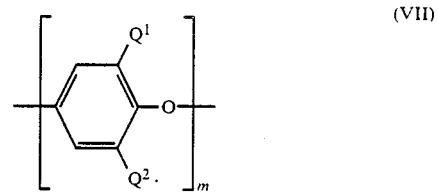

wherein $Q^1$ and $Q^2$ may be the same or different, and are each an alkyl group having from 1 to 4 carbon atoms, and m is a positive integer of 50 or more (generally 100 or more).

(b) Grafted Phenylene Oxide-Containing Condensates

The grafted condensate is obtained by graft polymerization of styrene or a mixture of styrene and at least one comonomer selected from the group consisting of styrene containing one or more alkyl groups having 1 or 2 carbon atoms, acrylonitrile, methyl methacrylate, and butyl acrylate onto the above-described PPO, as described in "Encyclopedia", Vol. 10, pp. 92-111 (1967)).

(8) Aromatic Polyesters

Aromatic polyesters which are used as the thermoplastic resins of the present invention are polyesters containing aromatic ring pendants in its repeating unit. They are polymers or copolymers derived by condensation of aromatic dicarboxylic acids or their ester-forming derivatives and diols or their ester-forming derivatives as main components.

Aromatic dicarboxylic acids which can be used for this purpose include terephthalic acid, isophthalic acid, phthalic acid, 2,6-naphthalenedicarboxylic acid, 2,7-naphthalenedicarboxylic acid, 1,5-naphthalene-dicarboxylic acid, bis(p-carboxyphenyl)methane, anthracenedicarboxylic acid, 3,3'-diphenylcarboxylic acid, 4,4'-diphenyl ether dicarboxylic acid, 4,4'-bix(carboxyphenoxy)ethane, 4,4'-diphenylsulfonedicarboxylic acid, and 4,4'-tert-phenylenedicarboxylic acid, and their ester-forming derivatives.

In the production of the aromatic polyesters of the present invention, 40 mol% or less of the aromatic dicarboxylic acid may be replaced by aliphatic dicarboxylic acids such as adipic acid, sebacic acid, azelaic acid, and dodecanedionic acid, alicyclic dicarboxylic acids such as 1,3-cyclohexanedicarboxylic acid and 1,4-cyclohexanecarboxylic acid, or their ester-forming derivatives.

Diols which can be used include aliphatic diols having from 2 to 20 carbon atoms, such as ethylene glycol, 1,2-propanediol, propylene glycol, 1,4-butanediol, neopentyl glycol, 1,5-pentanediol, 1,6-hexanediol, decamethylene glycol, cyclohexanediol, and 1,4-cyclohexanedimethanol.

As part of the above diol (50 mol% at most), long chain glycols having a molecular weight of from 400 to 6,000, i.e., polyethylene glycol, poly-1,3-propylene glycol, and polytetramethylene glycol can be used.

The above aromatic dicarboxylic acids, dicarboxylic acids other than the aromatic dicarboxylic acids, diols, and long chain glycols to be used in place of the diols may be used singly or in combination with each other.

Preferred examples of the aromatic polyesters that are used in the present invention are polyethylene terephthalate, polypropylene terephthalate, polybutylene terephthalate, polyhexamethylene terephthalate, polycyclohexylenedimethylene terephthalate, polyethylene-2,6-naphthalate, and polyethylene-1,2-diphenoxyethane-4,4'-dicarboxylate. Of these aromatic polyesters, polyethylene terephthalate and polybutylene terephthalate are preferred.

In connection with these aromatic polyesters, their methods of production and mechanical properties are well known, as described in "Encyclopedia", Vol. 11, pp. 62–128 (1969).

For the aromatic polyesters, the intrinsic viscosity as determined at 30° C. in a mixed solvent of phenol and tetrachloroethane (1/1 by weight) is usually from 0.4 to 1.5, preferably from 0.4 to 1.3, and particularly preferably from 0.5 to 1.3. If aromatic polyesters having an intrinsic viscosity of less than 0.4 are used, no reflector for a circular polarization antenna having a sufficiently high mechanical strength can be obtained. On the other hand, if it is in excess of 1.5, the resulting mold is deteriorated in surface properties.

(9) Oxymethylene Polymers

Oxymethylene polymers which are used as the thermoplastic resins of the present invention are thermoplastic resins made mainly from formaldehyde or trioxane. Typical examples of such oxymethylene polymers are a homopolymer of formaldehyde, a homopolymer of trioxane, and copolymers of formaldehyde and/or trioxane and from 0.1 to 15% by weight (preferably from 0.1 to 10% by weight) of cyclic ethers, cyclic acetals, and/or straight chain polyacetal.

Typical examples of such cyclic ethers and cyclic acetals are compounds represented by the following formula (VIII):

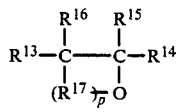

wherein $R^{13}$ to $R^{16}$ may be the same or different, and are each a phenyl group, an alkyl group, or a halogen-substituted alkyl group, when $R^{17}$ is a methylene group, an oxymethylene group, or an alkyl or halogenalkyl-substituted methylene or oxymethylene group, p is 0 or an integer of 1 to 3, and when $R^{17}$ is a group $(OCH_2CH_2)_l$—$OCH_2$, p is 1, and l is an integer of from 1 to 3.

Of the cyclic ethers or cyclic acetals represented by the general formula (VIII), those compounds in which $R^{13}$ to $R^{16}$ are alkyl groups having from 1 to 5 carbon atoms are preferred. Particularly preferred are those compounds in which $R^{13}$ to $R^{16}$ are alkyl groups having from 1 to 3 carbon atoms. They may be substituted by 1 to 3 halogen atoms (preferably a chlorine atom). Furthermore, it is preferred that cyclic ethers having from 3 to 5 rings or cyclic acetals having from 5 to 9 rings be used.

Comonomers which can be used include epoxide compounds such as ethylene oxide, propylene oxide, 1,2-butylene oxide, styrene oxide, epichlorohydrin, and oxetane or its derivatives (e.g., 3,3-bischloromethyloxetane and tetrahydrofuran), cyclic formals such as 1,3-dioxacycloheptane and 1,3,6-trioxacycloheptane, and substituted products resulting from substitution of the above compounds with a methyl group, an ethyl group, a chloromethyl group, a trichloromethyl group, or a phenyl group (e.g., 4-phenyl-1,3-dioxolan, and 4-methyl-1,3-dioxolan). In addition, derivatives resulting from substitution of the cyclic acetals (e.g., the above 1,3-dioxacycloalkane) by a methyl group, an ethyl group, a phenyl group, a chloromethyl group, or a vinyl group at the 2-position thereof can be used.

Furthermore, linear polyacetals which are decomposed during polymerization and act as comonomers can be used. These linear polyacetals can be produced by polymerization or copolymerization of the above cyclic acetals, and further from dihydric alcohols (e.g., ethylene glycol, diethylene glycol, 1,3-butylene glycol, propylene glycol, and p-xylylenediol) and aldehydes (in particular, formaldehyde).

In producing the oxymethylene polymers, numerous polymerization catalysts can be used. Preferred examples of the polymerization catalysts are those containing boron fluoride, thionyl chloride, fluorosulfonic acid, methanesulfonic acid, phosphorus trichloride, titanium tetrachloride, ferric chloride, zirconium tetrachloride, aluminum trichloride, stannous chloride, and stannic chloride. Particularly preferred are boron fluoride and boron fluoridecontaining substances (e.g., boron fluoride monohydrate, boron fluoride dihydrate, and boron fluoride trihydrate).

In general, the oxymethylene polymers are produced by polymerizing or copolymerizing formaldehyde and/or trioxane, or them with the above comonomers in inert organic solvents as described hereinafter at a temperature of from 20° to 115° C. (desirably from 60° to 100° C.) in the presence of the above polymerization catalysts.

Inert organic solvents which can be used for this purpose include cyclohexane, benzene, pentane, trichloroethylene, ligroin, carbon tetrachloride, octane, di-n-butyl ether, and petroleum ether. These solvents ae used in an amount of 20% by weight or less, preferably from 0.25 to 10% by weight, based on the amount of polymerizable substances, i.e., trioxane, formaldehyde and comonomers.

The reduced viscosity of the oxymethylene polymer is generally from 0.2 to 3.0 (the reduced viscosity is measured at 140° C. using a solution which has been prepared by dissolving 0.5 g of the polymer in 100 ml of γ-butyrolactone containing 2% of diphenylamine). Particularly preferred is a range of from 0.5 to 3.0. The M.I. is preferably from 0.1 to 50 g/10 min. and particularly preferably from 0.5 to 40 g/10 min.

The oxymethylene polymers are industrially produced and widely used in various fields. Their methods of production, and mechanical properties are well known (see "Encyclopedia", Vol. 10, pp. 319–324 (1969)).

(10) Vinyl Chloride Polymers

Vinyl chloride polymers which are used as the thermoplastic resins of the present invention are a vinyl chloride homopolymer and copolymers of vinyl chloride and 50% by weight or less (preferably 45% by weight or less) of compounds copolymerizable with vinyl chloride and containing at least one double bond. The degree of polymerization for these vinyl chloride polymers is usually from 400 to 4,500 and preferably from 400 to 1,500. Typical examples of these compounds containing at least one double bond are vinylidene chloride, ethylene, propylene, vinyl acetate, acrylic acid or methacrylic acid and their esters, maleic acid and its esters, and acrylonitrile. These vinyl chloride polymers can be produced by polymerizing vinyl chloride or copolymerizing vinyl chloride and vinyl compound as described above in the presence of free radical catalysts. Their methods of production are well known and widely used in various fields, as described in "Encyclopedia", Vol. 14, pp. 305–483 (1971).

In producing the inorganic filler-containing vinyl chloride polymers of the present invention, vinyl chloride polymers alone may be used as polymeric substances. In addition, compositions of the vinyl chloride polymers and other polymeric substances compatible therewith may be used. Examples of such polymeric substances are chlorinated polyethylene rubbers (the chlorine content is usually from 25 to 45% by weight) derived by chlorination of a homopolymer of ethylene or copolymers of ethylene and α-olefins having from 3 to 12 carbon atoms (the proportions of α-olefin is usually 20 mol% or less), having a molecular weight of from 10,000 to 1,000,000 (preferably from 10,000 to 100,000); the abovedescribed ethylene/propylene/diene copolymer rubber (EPDM), natural rubber, chloroprene rubber, chlorosulfonated polyethylene rubber, styrene/butadiene copolymer rubber (SBR), acrylonitrile/butadiene copolymer rubber, and butadiene homopolymer rubber, the Mooney viscosity (ML$_1$+4) of these rubbers being generally from 10 to 150.

The amount of the rubber to be compounded is 50 parts by weight or less based on the weight of the vinyl chloride polymers.

Of the thermoplastic resins, olefin polymers, polyamide resin, impact resistant resins (A), impact resistant resins (), phenylene oxide polymers. polycarbonate resins and aromatic polyester resins are preferred in that they are excellent in moldability, are well balanced in mechanical properties such as stiffness and creep resistance and, furthermore, are superior in weather resistance.

The thermoplastic resin alone may be molded by injection molding, pressure forming, etc., but a thermoplastic composition obtained by adding an inorganic filler to the thermoplastic resin may also be molded by injection molding, pressure forming, etc.

As the inorganic filler, those which do not decompose at the time of kneading and injection molding for the preparation of the composition and which do not react with oxygen and water should be chosen. The inorganic fillers used can be divided into groups: metal (e.g., aluminum, copper, iron, lead, and nickel) compounds, such as oxides and their hydrates (hydroxides), and sulfuric acid salts, carbonic acid salts, and silicic acid salts of the above metals; complex salts of the above metals; and mixtures thereof. Typical examples of these inorganic fillers are aluminum oxide (alumina), their hydrates, calcium oxides, magnesium oxide (magnesia), magnesium hydroxide, zinc oxide, oxides of lead such as lead oxide red and lead oxide, magnesium carbonate, calcium carbonate, basic magnesium carbonate, white carbon, asbestos, mica, talc, glass fiber, glass powder, glass beads, clay, diatomaceous earth (kaolin clay), silica, wollastonite, iron oxide, antimony oxide. titanium oxide (titania), lithopone, pumice powder, aluminum sulfate (glypsum, for example), zirconium carbonate, zirconium oxide, barium carbonate, dolomite, molybdenum disulfide, and iron sand. In the case of powdered inorganic fillers, it is preferred that the diameter be 1 mm or less (with the range of from 0.5 mm or less being more preferred). In the case of fibrous inorganic fillers, it is preferred that the diameter be from 1 to 500 microns (with the range of from 1 to 300 microns being more preferred, and the length be from 0.1 to 6 mm (with the range of from 0.1 to 5 mm being more preferred). Further, in the case of plate-shaped inorganic fillers, it is preferred that the diameter be 2 mm or less (with the range of 1 mm or less being more preferred).

Of these inorganic fillers, mica, talc, calcium carbonate, glass fiber, wollastonite are desirable in that they increase stiffness. Particularly preferred are talc, mica, and glass fiber. with regard to these inorganic fillers, details are described in "Encyclopedia", Vol. 6:, pp. 740–763 and Vol. 6, pp. 610–690 (1976).

Generally speaking, in the field of electronic equipment those which are usually flame-retardant are desired. Accordingly, inorganic fillers which are conventionally incorporated in synthetic resins as a flame retardant such as antimony oxide and those which do not generate moisture at the time of molding but generate moisture at temperatures higher than the molding temperature (preferably more than 50° C. higher than the molding temperature) such as magnesium hydroxide are preferably added partially or wholly as the inorganic filler.

In the case of the thermoplastic composition which is obtained by incorporating inorganic filler in thermoplastic resin, the content of the inorganic filler in the composition is at most 80 wt %, preferably not more than 75 wt % and more preferably 70 wt % or less. If it is more than 80 wt %, a homogeneous composition is obtained only with difficulty, and even if a homogeneous composition was obtained, no good product can be obtained when the electrical and electronic machinary and apparatus are manufactured by later described injection molding, pressure forming, etc.

(G) Molding process (1) Production by Injection Molding Method

In producing the molded product of the present invention by the injection molding method, the aforesaid thinwall body or laminated material is subjected to insert injection molding at the time of molding. In the practice of the insert injection molding, the above thinwall body or laminated material is placed between a male mold and a female mold and then the mold is closed. Thereafter, the thermoplastic resin or its composition containing an inorganic filler is introduced into the mold through a gate part of the male mold and cooled, and then the mold is opened, whereupon the desired molded product is obtained. In the insert injection molding, the resin temperature is higher than the melting point of the thermoplastic resin but lower than the decomposition temperature thereof. If the injection pressure is such that the gauge pressure in the nozzle portion of the cylinder of the injection molding machine is at least 100 kg/cm², molding in a form nearly equivalent with the shape of the mold can be attained. Furthermore, there can be obtained an article having good appearance. The injection pressure is usually from 200 to 2,000 kg/cm² and preferably from 200 to 1,500 kg/cm².

(2) Production of Vacuum Molding Method, Etc.

In accordance with this method, the thermoplastic resin or its composition containing an inorganic filler is extruded in the form of a sheet by a T-die molding method and laminate on the aforesaid tin-wall body or laminated material. The thus-produced laminated sheet is fixed by means of iron frames or snail-shaped devices, fitted to a jig that makes easy handling, and then introduced into an apparatus where it is heated by means of ceramic heaters or wire heaters arranged at upper and lower positions. The sheet starts to melt on heating. On continuing the heating after sagging of the sheet once occurred, the sheet is stretched in the frame. At this point when the above phenomenon is observed, the sheet is in good condition for molding of the sheet, so that no wrinkles or unevenness in thickness is formed. At this point, the sheet frame is taken out of the heating apparatus, placed on the top portion of a mold, and vacuum molded under a reduced pressure of 1 atmospheric pressure, whereupon the desired mold can be obtained. Thereafter, it is cooled with air or sprayed water and taken out of the mold.

In accordance with pressure molding, a sheet which has become easy to handle is placed on a mold, a chamber for applying pressure is placed on the sheet, and then the sheet is pressed toward the mold under a pressure of from 2 to 6 atmospheric pressure, preferably from 3 to 5 atmospheric pressure while at the same time the mold is pushed upward.

(3) Production by Stamping Molding

In producing the molded product of the present invention, a laminated sheet as produced by the above-described vacuum molding method is placed in a squeezing mold fitted to a vertical press machine and then heat-molded under a pressure of from 5 to 60 kg/cm² (preferably from 10 to 60 kg/cm², more preferably from 10 to 50 kg/cm²) whereupon the desired mold can be obtained. The mold is then cooled with air or sprayed water and then taken out of the mold. In this molding, the press time is usually at least 10 seconds, and generally from 10 to 60 seconds. In order to improve surface characteristics, it is preferred that the molding be performed under two-stage pressure conditions. At the first stage, the laminated sheet is pressed under a pressure of from 5 to 20 kg/cm² for from 10 to 40 seconds and at the second stage it is pressed under a pressure of from 40 to 50 kg/cm² for at least 5 seconds, whereupon there can be obtained a mold having superior surface smoothness. Particularly, when an inorganic filler-containing thermoplastic composition layer having poor fluidity is used, it is desirable to employ the above two-stage molding method.

(4) Molding Temperature

The molding temperature in the above injection molding method, vacuum molding method, pressure molding method, and stamping molding method varies with the type of the thermoplastic resin. Preferred molding temperature for several thermoplastic resins are shown in Table 1 below.

TABLE 1

| Type of Thermoplastic Resin | Vacuum Molding or Pressure Molding (°C.) | Stamping Molding (°C.) | Injection Molding (°C.) |
| --- | --- | --- | --- |
| Ethylene Polymer | 125–145 | 85–110 | 120–250 |
| Propylene Polymer | 165–175 | 125–135 | 170–290 |
| Polyamide Resin (a)* | 220–270 | 220–280 | 230–300 |
| Polyamide resin (b)** | 230–300 | 230–300 | 240–330 |
| Polycarbonate Resin | 140–230 | 240–300 | 250–300 |
| Styrene Polymer | 110–180 | 160–230 | 160–230 |
| Impact Resistance Resin (A) | 110–200 | 110–180 | 160–240 |
| Impact Resistance Resin (B) | | | |
| ABS, AAS, AES | 140–230 | 130–260 | 190–296 |
| MBS | 150–245 | 140–270 | 200–290 |
| Phenylene Oxide Polymer | 150–250 | 130–240 | 220–300 |
| PET | 130–200 | 90–180 | 250–300 |
| PBT | 100–180 | 70–160 | 230–280 |
| Oxymethylene Polymer | 160–200 | 140–200 | 190–230 |
| Vinyl Chloride Polymer | 150–200 | 130–180 | 160–200 |

*By ring-opening polymerization (e.g., polyamide 6)
**By polycondensation (e.g., polyamide 6.6)

(5) Other Molding Process

Besides the injection molding process, thermoforming process, and stamping molding process, there are compression molding process, hollow molding process using a press which is conventionally used. In these molding processes the above described thin-wall body or laminated material is beforehand inserted between the male and female dies of the metal mold as in the case of injection molding process, and then thermoplastic resin or a composition thereof is molded by a usual method, whereby there is obtained one body molding. Further, in lamination molding process, thermoplastic resin or a composition thereof is laminated on the above described thin-wall body or laminated material by dry lamination process, hot lamination process, extruding lamination process, etc., to obtain one body molding.

In the manufacture of the molded product having printed circuit board of this invention, the injection molding process and the stamping molding process are preferable, and the injection molding process is more preferable because it is not only easy and simple but also capable of producing molded products of various complicated shapes.

(H) Conductive Metal Layer

The conductive metal layer required for the printed circuit board of this invention can be formed on the thinwall body or laminated material (hereinafter collectively referred to as "thin-wall body") using metal foil as later described, or by vacuum deposition method of metal, electroless plating method, and combined use of electroless plating and electroplating methods.

(1) Kind of metal

Example of the metal used include aluminum, gold, silver, copper, nickel, and platinum; and an alloy containing these metals as a the main ingredient (more than 50 wt %), but in general copper, which has good electroconductivity, is preferred.

(2) Foil

The thickness of the metal foil is usually 5 to 500 microns, preferably 10 to 300 microns, and more preferably 15 to 100 microns. Among the above described metals electrolytic copper foil of 15 to 50 microns in thickness is preferably used. The metal foil laminated on the thin-wall body is pattern-wise etched in a conventional manner to form a circuit.

(3) Vacuum deposition

As the vacuum deposition method of metal there may be applied vacuum heat deposition method using resistance heating, electron beam heating, induction heating, thermal radiation heating, etc. or sputtering, and the like. Especially for use as micro-circuit, platinum and gold are preferably used, and in the case where a circuit is to be formed by etching after the formation of this film, copper and aluminum, an also an alloy containing these metals as the main ingredient are used by preference.

The thickness of the conductive thin film vacuum deposited may be freely chosen depending on the condition of the apparatus employed, but it is usually 100 Å to 100 microns, and preferably 1000 Å to 20 microns.

In addition, the conductive surface (path) having these metals vacuum deposited can be electroplated with copper, nickel, gold, etc. for the purpose of surface protection and anticorrosion, or can be soldered by passing through a solder bath.

The circuit may also be formed on the surface and inner surface of through holes of the thin-wall body according to the so-called fully additive process utilizing the vacuum deposition technique. Generally speaking, an insulation material used in the fully additive process is one which has an adhesive coated on the surface, but the thinwall body of this invention shows excellent adhesion to the vacuum deposited film even without the use of an adhesive, and a printed circuit board can be easily obtained. For example, the thin-wall body is cut into lengths of predetermined dimension and holes are bored by either punching, drilling, or pressing. Then, a negative pattern with respect to circuit is formed by screen printing or non-circuit portion is masked with a photosensitive material, and vacuum deposition is carried out on the masked thin-wall body so that vacuum deposited metal film of a prescribed thickness can be formed on the unmasked circuit portion.

In the fully additive process, a layer which functions not only as a photosensitive material but also as an adhesive is generally formed, and by exposing to light this layer, only the circuit portion is made adhesive and readily capable of forming a deposition film thereon. In the printed circuit board of this invention, however, such a layer is not needed, and the vacuum deposition metal film may be formed directly on the surface of the thin-wall body with good adhesion, so that it is not only adapted for mass production system, but also free from defects in the ordinary etching (e.g., pattern break) and a precise circuit can be formed with ease. After the vacuum deposition, gold, tin, solder, etc. can also be plated for the purpose of protection and anticorrosion of the circuit and further molding IC chip.

The printed circuit board of this invention can be obtained by any of adhesive printing process, adhesive photograph process and direct process that are practical in the fully additive process.

(4) Electroless plating

In general, nickel plating, highly corrosion resistant zinc nickel alloy plating, copper plating, etc. are known as the electroless plating (or chemical plating), but for use as the printed circuit substrate copper sulfate plating is usually employed which can provide densely plated coating of uniform thickness on the entire surface of a substrate in contact with the plating solution with outstanding adhesion and ductility between the substrate and the plated coating. The copper sulfate plating is advantageous in that the plated coating is made of fine crystals having stabilized workability and excellent physical properties.

In the copper sulfate plating, metallic copper is generally supplied into the plating solution, and in order to enhance the electrical conductivity and the uniformity in electrodeposition of the solution, copper sulfate and sulfuric acid are added. Further, chloride ion (as catalyst) and a suitable amount of brightening agent are used. In addition, polyoxyethylene and polyoxypropylene derivatives may be added to improve the uniformity in thickness of the plated coating. The representative composition of the copper sulfate plating solution comprises 5 to 40 g of copper sulfate ($CuSO_4$ $5H_2O$) per 1 liter of an aqueous solution; a pH adjuster (buffer) such as sodium hydroxide (NaOH), ammonium chloride ($NH_4Cl$), etc.; a compound to prevent extraordinary deposition of copper in the aqueous solution such as sodium salt of ethylenediaminetetraacetic acid (EDTA-2Na); and a reducing agent such as formalin (HCHO). The conductive surface (path) obtained by the electroless plating can also be electroplated with copper, nickel, gold, etc. for the purpose of surface protection and anticorrosion, or soldered by passing through a solder bath.

The fully-additive process may also be carried out in this invention utilizing the electroless plating technique wherein the circuit is formed by electroless plating the surface and inner surface of through holes of the above described thin-wall body, wherein the etching step as in the case of metal foil laminated plate is not needed.

(I) Printed Circuit Board

The printed circuit board used in this invention comprises the thin-wall body or laminated material and the conductive metal layer as described above. The term "printed circuit board" herein used include those before and after the formation of circuit. Various other materials used in the laminated material are described later, in which case, however, it is necessary that the thin-wall body should be interposed between the conductive metal layer and the other material layer. It is preferred that in order to improve the adhesion between the printed circuit board and the resin layer (i.e., the layer of the thermoplastic resin or the composition thereof) the ethylenic copolymer (A) or (B) be interposed therebetween.

(1) Other Material

As other material there may be mentioned the plate of the metal or alloy of the above described conductive metal layer, glass or aramid woven or nonwoven fabric, and film of heat-resistant thermoplastic resin such as polyamideimide, polyimide, and polyester. The thickness of the metal or alloy is usually 0.02 to 3.0 mm, and preferably 0.1 to 2.0 mm. Also, the thickness of the glass woven fabric or nonwoven fabric is 5 microns to 5 mm, and preferably 20 microns to 1.0 mm. Further, the thickness of the film of heat resistant thermoplastic resin is 3 microns to 1.0 mm, and preferably 10 to 200 microns. A product obtained by laminating glass woven fabric between the thin-wall bodies is particularly preferred since deformation due to the flow of the molten resin at the time of injection molding can be prevented and the resulting molded product has an improved dimensional stability.

(2) Preparation of Printed Circuit Board

The thin-wall body of this invention is heat-treated under pressure and then the conductive metal layer may be formed on one side of the resulting crosslinked product by any one of the vacuum deposition, electroless plating, or combination of electroless plating and electroplating (hereinafter referred to as "process (A)"), or metal foil and the thin-wall body may be heat-treated under pressure. Also, the conductive metal layer may be formed on one side of the resulting crosslinked product, and moreover, either of the ethylenic copolymer (A) or (B) may be laminated on another side of the thin-wall body. The latter is used for laminating on the surface of molded thermoplastic resin (or composition) product.

Since the thin-wall body obtained in this invention exhibits adhesiveness above 100° C., the effect of this invention can be much enhanced by bonding it with the metal layer simultaneously with the crosslinking treatment. That is to say, the mixture of ethylenic copolymer (A) and ethylenic copolymer (B) shows thermoplasticity at a temperature below 250° C., but when the mixture is heat-treated under pressure above 100° C. crosslinking reaction takes place and at the same time the adhesiveness is manifested.

In the case where air, etc. are entrapped between the metal foil and the thin-wall body it is necessary to carry out thermocompression bonding by the use of a hot press or hot roll. Although satisfactory adhesion can be obtained even below 300° C., where the heat resistance is required or desired, the compression bonding is preferably carred out at a temperature as high as possible (usually 200° to 300° C.).

(J) Molded Product Having Printed Circuit Board

The molded product of this invention can be prepared by molding the printed circuit board and thermoplastic resin or a composition thereof according to the above described molding process. Also, it can be prepared by forming the conductive metal layer in such a manner that the thin-wall body or laminated material is molded together with thermoplastic resin or a composition thereof, and a conductive metal layer is formed on the surface of the thin-wall body by insertion molding or other molding processes.

The molded product of this invention will be explained with reference to the drawings. FIG. 1 is a cross sectional view of the representative molded product of the present invention wherein 1 indicates thermoplastic resin or the composition thereof (resin layer), and 2 indicates printed circuit board. FIGS. 2 through 7 are a partially enlarged cross sectional view of the molded products of FIG. 1, wherein resin layer 1, thin-wall body 4 and conductive metal layer 3 or these and other material layer (heat-resistant film 5, glass woven or nonwoven fabric 6) are laminated.

Figure 2:
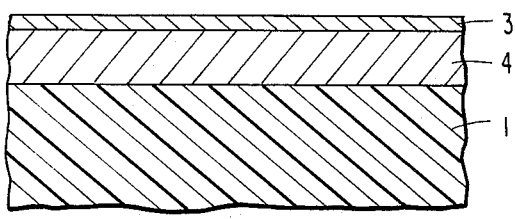
FIGS. 2 through 7 show a partially enlarged crosssectional view of the molded products of FIG. 1.
Figure 3:
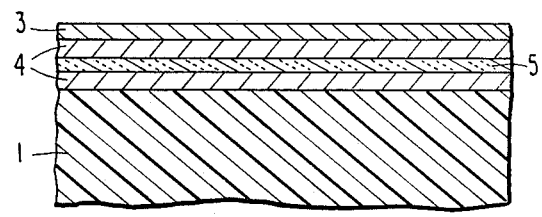
Figure 5:
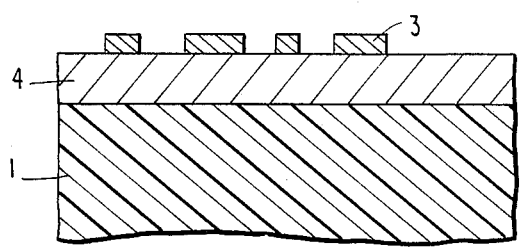
Figure 6:
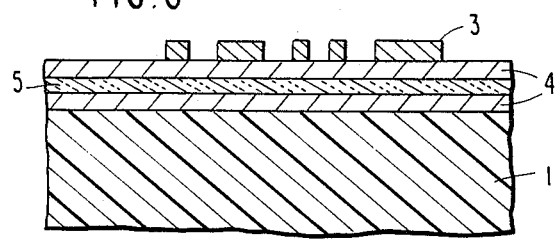
Figure 7:
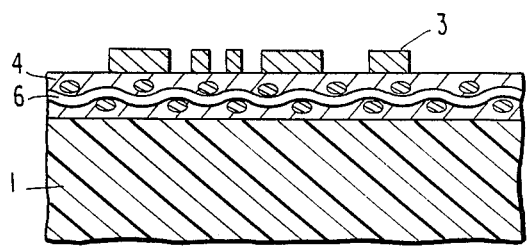

FIG. 2 shows the case where thin-wall body 4 being interposed between resin layer 1 and conductive metal layer 3; FIG. 3 shows the case where thin-wall body 4, heat resistant film 5, thin-wall body 4 and conductive metal layer 3 are successively laminated on resin layer 1; and FIG. 4 indicates the case where thin-wall body 4, glass woven or nonwoven fabric 6, thin-wall body 4, and conductive metal layer 3 are successively laminated on resin layer 1. FIG. 5 through 7 are partially enlarged cross sectional views of the molded products of this invention where conductive metal layer 3 and thin-wall body 4 with or without one or more other material layers are molded together with resin layer and then a circuit is formed by etching or where a circuit is formed by etching and then the molding was carried out.

Furthermore, it is also possible that a circuit is formed on the thin-wall body and then this printed circuit board is molded together with the thermoplastic resin or a composition thereof, or the thin-wall body and the thermoplstic resin or a composition thereof are molded and then a circuit may be formed on the resulting molded product by plating, etc.

Figure 10:
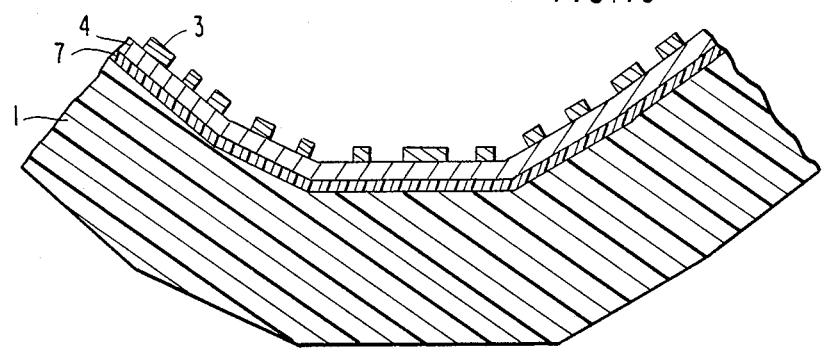
FIG. 10 shows a partially enlarged cross-sectional view of a molded product having a printed circuit board of this invention.

Also, as shown in FIGS. 8 and 9, ethylenic copolymer (A) or (B) (7 in FIGS. 8 and 9) may be bonded to thinwall body before or after formation of a circuit, and the surface of the bonded copolymer layer and the surface of a molded product are superposed in a face to face relation after formation of a circuit as shown in FIG. 10, followed by heating under pressure, whereby a molded product having a printed circuit board can be obtained. In this case the bonding temperature is usually 40° to 200° C., preferably 80° to 180° C., and more preferably 100° to 150° C. The pressure is generally 1 to 100 kg/cm, and at a temperature above 100° C. the pressure is sufficient if it is high enough to exclude air bubbles entrapped on the bonded surface. According to this process, the adhesion as well as the heat resistance can be improved. It is assumed that the reacting radicals of the laminated ethylenic copolymer (A) or (B) react with both the crosslinked thin-wall body and the bonded surface of the resin layer at the same time.

A printed circuit board can be easily provided even on a curved surface or complex surface in shape of a molded product according to this invention since either of the ethylenic copolymers (A) and (B) (part of 7 in FIGS. 8 and 9) is so flexible before the thermocompression bonding that it can completely conform to the shape of the irregular surface. Moreover, the printed circuit board of this invention can be bonded even on modified cross section by devising an apparatus which is capable of uniform thermocompression bonding (for example press metal mold).

Other processes which are generally employed in manufacture of multilayer laminated product can also be used. For example, it is a process such that the thin-wall bodies are uniformly disposed between respective laminated products, and temporary bonding is carried out at room temperature, and thereafter the resulting laminated product is subjected to heat treatment under pressure at a temperature above 40° C. In this process, each layer can be temporarily bonded one by one to finally laminate all of them and then subjected to heat treatment under pressure, whereby a multilayered printed circuit board can be lamination molded to a molded product.

Further, in a process wherein a circuit beforehand formed on the thin-wall body is laminated, various kinds of three dimensional circuit as shown below can be formed.

Figure 11:
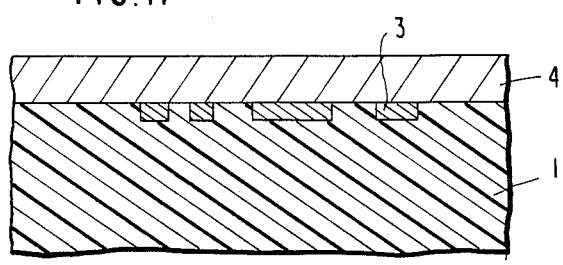
FIGS. 11 through 14 show a partially enlarged cross-sectional view of molded products having a printed circuit board carrying a three-dimensional circuit.
Figure 12:
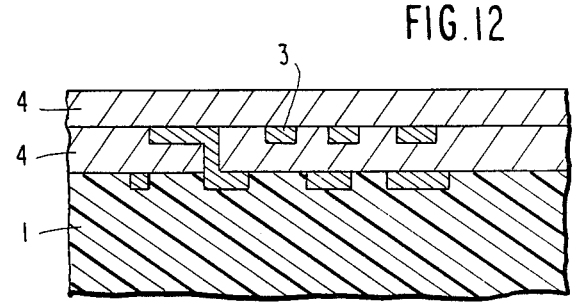
Figure 13:
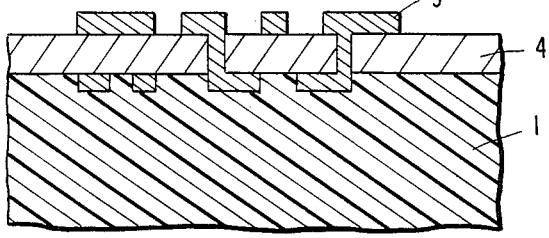
Figure 14:
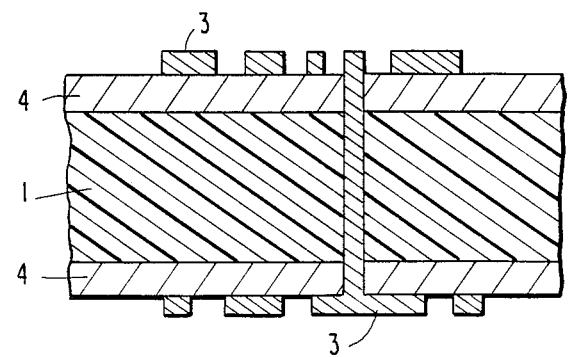

FIG. 11 indicates the case where circuit surface 3 is in contact with resin layer 1. FIGS. 12 and 13 indicate the case where the laminated circuit with through hole(s) (printed circuit board) is formed, and then this printed circuit board and resin layer 1 are laminated. FIG. 14 indicates the case where thin-wall body 4 is laminated on both sides of resin layer 1, and they are connected with a through hole. In this case both the upper and lower surfaces of the molded product are provided with a circuit, and yet these circuits may be connected by the through hole.

Also, as shown in FIG. 5, thin-wall body 4 may be disposed on the surface of a molded product, and then conductive layer is formed only on the circuit portion by additive process or the like.

The thin-wall body with a circuit obtained in this invention can be used as a thin-wall body (film or sheet) which is capable of forming a circuit integrated with machinery or apparatus or a molded product.

The molded product of this invention possesses the following effects (characteristics).

(1) Since the printed circuit board and the thermoplastic resin layer or the thermoplastic resin composition layer containing an inorganic filler can be molded together, not only it is possible to omit a step by which a printed circuit board is anchored to a molded product as usual, but also there are no troubles accompanying the step.
(2) As a circuit can be formed within the interior of molded product, it is possible to make the product more compact and more lightweight.
(3) As three-dimensional circuit can be formed, complicated circuit can be avoided, and thus conneceters required for the complicated circuit decrease in number and reduces accidents.
(4) In manufacture of molded products (for electronic equipment) thermoplastic resins hitherto conventionally used can be used, and therefore variety of products can be expanded.
(5) As the thin-wall body has excellent heat resistance, soldered joint can be made on the surface of the thin-wall body.
(6) The thin-wall body has excellent electrical characteristics (for example, insulation property, dielectric strength, discharge tangent performance (tan δ)).

Since the molded product of this invention exhibits the above described effects, it can be utilized as a part of various kinds of macinery and apparatus and molded products. The representative of these machinery and apparatus and molded products are shown below.
(1) Domestic machinery and apparatus such as washing machine, refrigerator, electronic over, television receiver, video camera, radio cassette recorder, speaker unit, etc.
(2) Motorcar accessaries (for example, instrument panel, light, wiper, door).
(3) Machine in office use (for example, word processor, printer thereof, wet or dry-type duplicating machine, facsimile, computors, desk computer).
(4) Others, such as camera, switch board, telephone, fire alarm, clock.

EXAMPLES AND COMPARATIVE EXAMPLES

With reference to examples, this invention will be more fully explained below.

In the Examples and Comparative Examples the peeling strength was measured according to JPC-FC-240C, i.e., a conductive metal layer (copper foil, etc.) is etched so that 3 mm is left but the masking is removed, and the peeling strength was measured when the conductive metal layer was peeled at an angle of 90° (drawing velocity: 50 mm/min.).

The following shows the thermoplastic resin, the inorganic filler, and the mixture of ethylenic copolymer (A) and ethylenic copolymer (B) used in the Examples and Comparative Examples.

(A) Thermoplastic Resin

The following thermoplastic resins were used.
(1) Olefinic Polymer

Propylene homopolymer whose MFI was 2.0 g/10 min. (hereinafter referred to as "PP(A)") and propylene-ethylene block copolymer whose MFI was 15 g/10 min. (ethylene content 15 wt %, hereinafter referred to as "PP(B)") were used.

(2) Polycarbonate Resin

As a polycarbonate resin, an intermediate density polycarbonate resin (density: about 1.2 g/cm$^3$; MFI: 4.5 g/10 min.; hereinafter referred to as "PC") as prepared using bisphenol A as a major starting material was used.

(3) Acrylonitrile-butadiene-styrene Terpolymer (ABS resin)

A 20 liter autoclave made of stainless steel was charged with 280.0 g (as solids) of a styrene-butadiene copolymer rubber (butadiene content: 80 wt %; gel content of rubber: 80%), 2.0 g of ammonium persulfate, 80.0 g of sodium rosinate for disproportionation, 21.0 g of laurylmercaptan, and 8.0 l (liters) of water. They were uniformly mixed, and 2,520 g of styrene and 1,200 g of acrylonitrile were added thereto. The resulting mixture was stirred, and then, raised in temperature to 70° C. while stirring. At this temperature, polymerization was performed with stirring for 10 hours. To the thus-prepared polymer (grafted product)containing latex-like material was added a 5% aqueouos solution of aluminum sulfate to coagulate the grafted product. The coagulated product was washed with about 5,200 ml of an about 1% aqueous solution of sodium hydroxide, and further, with a large amount (about 30 liters) of hot water maintained at 70° C. The grafted product was dried at about 80° C. under reduced pressure one day and night. There was thus obtained 3,785 g of white powdery grafted product. The Izod impact resistance of the grafted product was 7.5 kg.cm/cm notch, and its tensile strength was 468 kg/cm$^2$. The Vicat softening point of the polymer was 101.5° C. The rubber-like material content of the grafted product was 7.3 wt %. This grafted product is hereinafter referred to as "ABS".

(4) Acrylonitrile-chlorinated polyethylene-styrene Terpolymer (ACS)

100 Parts by weight of chlorinated polyethylene having a Mooney viscosity (MS$_{1+4}$ 100) of 75 (chlorine content: 36.2 wt %; amorphous; the molecular weight of the polyethylene starting material: about 250,000), 400 parts by weight of an acrylonitrile-styrene copolymer resin (acrylonitrile content: 23 wt %), and 2 parts by weight of dibutyl tin maleate-based stabilizer were melt kneaded for 10 minutes by the use of rolls the surface temperature of which was set at 180° C. The thus-obtained mixture was pressed for 5 minutes under a pressure of 100 kg/cm$^2$ by the use of a press machine maintained at 200° C. and then for 2 minutes under a pressure of 100 kg/cm$^2$ by the use of a cooling press machine to produce a plate. For the thus-produced plate, the Izod impact strength (notched) was 8.0 kg.cm/cm, the tensile strength was 340 kg/cm$^2$, and the Vicat softening point was 94.5° C. The mixture is hereinafter referred to as "ACS".

(5) Aromatic Polyester

Polyethylene terephthalate whose limiting viscosity was 0.65 (hereinafter referred to as "PET" and polybutylene terephthalate whose limiting visocity was 0.85 (hereinafter referred to as "PBT") were used.

(6) Modified PPO (grafted product)

A modified PPO was prepared as follows.

At first, 2,6-xylenol was subjected to polycondensation by an oxidation coupling process to prepare poly 2,6-dimethylphenylene-1,4-ether (limiting viscosity (measured in chloroform at 30° C.): 0.53 dl/g; hereinafter referred to as "PPO (1)"). After 25 parts by weight of styrene monomer, 10 parts by weight of styrene homopolymer (melt flow index (measured at a temperature of 190° C. with a load of 10 kg according to ASTM D-1238): 13.0 g/10 min.) and 2.1 parts by weight of di-tertiary-butyl peroxide were mixed with 100 parts by weight of PPO (1) for 10 minutes by means of a Henschel mixer, the resulting mixture was extruded by means of a biaxial extruder (diameter 30 mm: resin temperature 270° C.) to give a styrene-grafted PPO mixture (hereinafter referred to as "modified PPO").

(B) Inorganic Filler

Talc of 3 microns in average particle diameter (aspect ratio: about 7), mica of 3 microns in average particle diameter (aspect ratio: about 8), glass fiber (monofilament diameter: 11 microns; cut length 3 mm, hereinafter referred to as "GF"), and calcium carbonate of 0.8 micron in average particle diameter (hereinafter referred to as "$CaCO_3$") were used.

(C) Mixture of Ethylenic Copolymers

The following mixtures of ethylenic copolymer (A) and ethylenic copolymer (B) were used:

a mixture of an ethylene-acrylic acid copolymer whose M.I. was 300 g/10 min. (density: 0.954 g/cm$^3$; acrylic acid copolymerization ratio: 20 wt %; hereinafter referred to as "EAA") and a saponified product (degree of saponification: 97.5%; M.I.: 75 g/10 min.; density: 0.951 g/cm$^3$; hereinafter referred to as "Saponified product") of an ethylenevinyl acetate copolymer, in which vinyl acetate copolymerization ratio was 28 wt % (mixture ratio: 1/1 (weight ratio); hereinafter referred to as "Mixture (I)");

a mixture of an ethylene-methacrylic acid copolymer whose M.I. was 200 g/10 min. (density: 0.950 g/cm$^3$; methacrylic acid copolymerization ratio: 25 wt %) and the above described Saponified Product (mixture ratio: 1/1 (weight ratio); hereinafter referred to as "Mixture (II)");

a mixture of an ethylene-ethyl acrylate-maleic anhydride terpolymer whose M.I. was 212 g/10 min. (ethyl acrylate copolymerization ratio: 30.7 wt %; maleic anhydride copolymerization ratio: 1.7 wt %) and an ethylene-methyl methacrylate-2-hydroxyethyl methacrylate terpolymer whose M.I. was 123 g/10 min. (methyl methacrylate copolymerization ratio: 20.7 wt %; 20hydroxyethyl methacrylate copolymerization rato: 11.7 wt % (mixture ratio: 1/1 (weight ratio); hereinafter referred to as "Mixture (III)"); and a mixture of an ethylene-methyl methacrylate-maleic anhydride terpolymer whose M.I. was 105 g/10 min. (methyl methacrylate copolymerization ratio: 20.5 wt %; maleic anhydride copolymerization ratio: 3.1 wt %) and an ethylenemethyl methacrylate-glycidyl methacrylate terpolymer (methyl methacrylate copolymerization ratio: 18.6 wt %; glycidyl methacrylate copolymerization ratio: 12.7 wt %) (mixture ratio: 3.7 (weight ratio); hereinafter referred to as "Mixture (IV)").

These mixtures were all prepared by dry blending for 5 minutes by means of a Henschel mixer.

Mixtures (I) through (IV), EAA and Saponified Product were respectively molded into films having a thickness of 100 microns under the condition of cylinder temperature as shown in Table 2 by means of an extruder equipped with T-die (diameter: 40 mm; die width: 30 cm; rate of rotation: 85 rpm). When extraction residue of the films obtained was measured in any case, it was 0%.

TABLE 2

| Kind of mixture and the like | Cylinder temperature (°C.) | | Die temperature (°C.) |
|---|---|---|---|
| | $C_1$ | $C_2$ | |
| Mixture (I) | 120 | 120 | 125 |
| Mixture (II) | 110 | 115 | 120 |
| Mixture (III) | 115 | 120 | " |
| Mixture (IV) | " | 115 | " |
| EAA | 120 | 140 | 140 |
| Saponified Product | " | " | " |

EXAMPLES 1 TO 14 AND COMPARATIVE EXAMPLES 1 AND 2

Printed circuit boards were prepared by laminating each of the films thus obtained and electrolytic copper foil (thickness: 35 microns) at 250° C. and 300° C., respectively, for 10 minutes under a pressure of 20 kg/cm$^2$ (gauge pressure) by means of a hot press machine.

Each of the printed circuit boards obtained was inserted into an injection molding machine (mold clamping force: 200 tons) such a manner the electrolytic copper foil of the printed circuit board was contacted with a male die surface of the metal mold. After closing the mold, a thermoplastic resin as shown in Table 3 (note: ABS containing 30 wt % of talc used in Example 12: ABS containing 30 wt % of GF used in Example 13; and ABS containing 30 wt % of $CaCO_3$ used in Example 14) was insertion-injection molded (injection pressure: 90 kg/cm$^2$; resin temperature as shown in Table 3) to prepare a grip of telephone receiver having a shape of 2.5×4×10 cm with a thickness of 2 mm.

TABLE 3

| Example or comparative example No. | Kind of film | Kind of thermoplastic resin | Resin temperature (°C.) | Extraction residue (%) |
|---|---|---|---|---|
| Example 1 | Mixture (I) | ABS | 230 | 78 |
| Example 2 | Mixture (II) | " | " | 80 |
| Example 3 | Mixture (III) | " | " | 79 |
| Example 4 | Mixture (IV) | " | " | 76 |
| Example 5 | " | PC | 280 | 98 |
| Example 6 | " | PP (A) | 240 | 83 |
| Example 7 | " | PP (B) | " | 85 |
| Example 8 | " | ABS | " | 81 |
| Example 9 | " | ACS | 200 | 76 |
| Example 10 | " | Modified PPO | 260 | 88 |
| Example 11 | " | PBT | 270 | 92 |
| Example 12 | " | ABS | 230 | 79 |
| Example 13 | " | " | " | 78 |
| Example 14 | " | " | " | 76 |
| Comparative Example 1 | EAA | " | " | 0 |
| Comparative Example 2 | Saponified Product | " | " | 0 |

EXAMPLES 15 TO 28 AND COMPARATIVE EXAMPLES 3 AND 4

Figure 4:
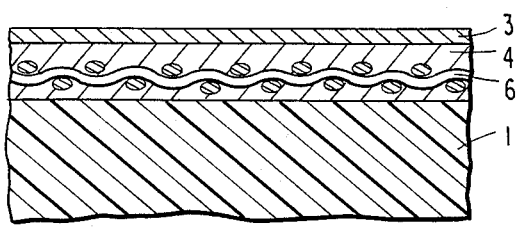

Printed circuit boards were prepared by laminating each of the films obtained as above and electrolytic copper foil (thickness: 35 microns) at 250° C. and 300° C., respectively, for 10 minutes under a pressure of 20 kg/cm² (gauge pressure). 100 g/m² of glass plain woven fabric and 90 g/m² of aramid nonwoven fabric were interposed between the respective films in Examples 26 and 27, respectively, as shown in FIG. 4.

Either of ethylenic copolymer (A) and ethylenic copolymer (B) shown in Table 4 as adhesive layer was laminated onto each of the thus prepared printed circuit boards at 100° C. in a thickness of 10 microns.

A thermoplastic resin as shown in Table 4 (note: ABS containing 30 wt % of talc used in Example 26; ABS containing 30 wt % of GF used in Example 27; and ABS containing 30 wt % of CaCO₃ used in Example 28) was insertion-injection molded (injection pressure: 90 kg/cm²; resin temperature as shown in Table 4) to prepare a grip of telephone receiver having a shape of 2.5×4×10 cm with a thickness of 2 mm.

The adhesive layer of the printed circuit board and the inside surface of the molded product (grip of telephone receiver) thus obtained were superposed in a face to face relation, and laminated by thermocompression bonding at a temperature of 140° C. and a pressure of 1 kg/cm² (gauge pressure).

TABLE 4

| Example or comparative example No. | Kind of film | Kind of adhesive layer | Kind of thermoplastic resin | Resin temperature (°C.) | Extraction residue (%) |
|---|---|---|---|---|---|
| Example 15 | Mixture (I) | (A) | ABS | 230 | 78 |
| Example 16 | Mixture (II) | (B) | " | " | 80 |
| Example 17 | Mixture (III) | " | " | " | 79 |
| Example 18 | Mixture (IV) | " | " | " | 76 |
| Example 19 | " | " | PC | 280 | 98 |
| Example 20 | " | (A) | PP (A) | 240 | 83 |
| Example 21 | " | (B) | PP (B) | " | 85 |
| Example 22 | " | " | ABS | " | 81 |
| Example 23 | " | " | ACS | 200 | 76 |
| Example 24 | " | " | Modified PPO | 260 | 88 |
| Example 25 | " | " | PBT | 270 | 92 |
| Example 26 | " | (A) | ABS | 230 | 79 |
| Example 27 | " | (B) | " | " | 78 |
| Example 28 | " | " | " | " | 76 |
| Comparative Example 3 | EAA | " | " | " | 0 |
| Comparative Example 4 | Saponified Product | (A) | " | " | 0 |

TABLE 5

| Example No. | Kind of thermoplastic resin | Resin temperature (°C.) |
|---|---|---|
| 29 | ABS | 230 |
| 30 | " | " |
| 31 | " | " |
| 32 | " | " |
| 33 | PP (A) | 240 |

EXAMPLES 34 AND 35 AND COMPARATIVE EXAMPLE 5

Film of Mixture (III) (thickness: 100 microns) was masked at non-circuit portion by means of a screen printing machine.

The film thus obtained was plated at 72° C. in a chemical plating solution having the following composition to form plated copper coating (thickness: about 20 microns) on both sides of the film.

EXAMPLES 29 TO 33

Under the same conditions as in Example 1, printed circuit boards were prepared by laminating on electrolytic copper foil (thickness: 35 microns) the film (thickness: 75 microns) including therein 400 g/m² of glass plain woven fabric (Example 29) or 400 g/m² of (chipped) strand glass fiber mat (Example 30); by laminating the above described electrolytic copper, film of Mixture (IV) (thickness: 50 microns), film of polyimide (thickness: 25 microns), and film of Mixture (IV) (thickness: 50 microns) in this order (Example 31); by the same procedure as in Example 31 except that film of polyester (thickness: 25 microns) (trade name "Mylar", manufactured by duPont Co., U.S.A.) was used instead of the film of polyimide (Example 32); or by laminating electrolytic copper foil (thickness: 17 microns), film of Mixture (I) (thickness: 25 microns), film of polyimide (thickness: 25 microns), and film of Mixture (I) (thickness: 25 microns) in this order (Example 33).

Using the printed circuit boards obtained above, a thermoplastic resin as shown in Table 5 was insertion-injection molded at the resin temperature shown in Table 5 in the manner as in Example 1 to prepare a grip of telephone receiver.

| | |
|---|---|
| CuSO₄.5H₂O | 10 g |
| EDTA.2Na.2H₂O | 30 g |
| HCHO (36%) | 3 ml |
| NaOH | 12 g |
| Water to make | 1 l |

After the plating was complete, the above described masking was removed, and the resulting film was washed with water, and dried (Example 34).

Platinum was vacuum deposited on the surface of films (thickness: 100 microns) of Mixture (II) (Example 35) or EAA (Comparative Example 5) under a vacuum of $2 \times 10^{-6}$ torr by the use of a vacuum deposition apparatus (trade name "JEE-4X type", manufactured by Nippon Denshi Co.), whereby metallic coating having a thickness of 5000 Å was formed on each film.

Using each film on which copper was plated or platinum was vacuum deposited, insertion-injection molding of a mixture (pellets) which was obtained by dry blending 62 parts by weight of ABS, 25 parts by weight of hexachlorocyclopentadiene dimer, and 13 parts by weight of antimony trioxide (average particle diameter: 1.0 micron) for 5 minutes at a resin temperature of 230° C. by the use of Henschel mixer, followed by melt kneading, was carried out, in the same manner as in Example 1. Thus, a grip of telephone receiver was prepared.

EXAMPLES 36 AND 37 AND COMPARATIVE EXAMPLE 6

In the same manner as in Examples 34, 35 and Comparative Example 5, the films having copper plated layer or platinum vacuum deposited layer on one surface were prepared. On the side opposite to the conductive circuit of each oo f the printed circuit boards thus obtained, the ethylenic copolymer (B) as adhesive resin was laminated at a temperature of 120° C. to a thickness of 30 microns (Examples 36 and 37 and Comparative Example 6, respectively).

Also, as mixtures (pellets) which was obtained by dry blending 62 parts by weight of ABS, 25 parts by weight of hexachlorocyclopentadiene dimer, and 13 parts by weight of antimony trioxide (average particle diameter: 1.0 micron) for 5 minutes at a resin temperature of 230° C. by the use of Henschel mixer, followed by melt kneading, was insertioninjection molded to prepare a grip of telephone receiver.

The adhesive layer of each printed circuit board and the inside surface of the molded product thus obtained were laminated in the same manner as in Example 15.

EXAMPLE 38

By injection molding ABS at a resin temperature of 230° C. on a film of Mixture (III) having a thickness of 100° microns of a camera body, 3×5×8 cm with a thickness of 2 mm was formed.

On the surface of a part of the camera body, wherein the film of Mixture (III) had been inserted, copper was plated as in Example 34 (thickness: 17 microns).

EXAMPLES 39 TO 41 AND COMPARATIVE EXAMPLES 7, 8 AND

Various printed circuit boards were prepared by heat-pressing copper foil (thickness: 17 microns) and film of Mixture (I) (thickness: 100 microns) as in Example 1 (Example 39); by laminating copper foil (thickness: 17 microns), film of Mixture (I) (thickness: 50 microns), glass plain woven fabric used in Example 29, and film of Mixture (I) (thickness: 50 microns) in this order (Example 40); by plating films (thickness: 100 microns) of EAA (Comparative Example 7) and Saponified Product (Comparative Example 8), as in Example 34; or by coating a epoxy resin on electrolytic copper foil (thickness: 35 microns) and drying (Comparative Example 9).

The printed circuit boards and ABS were stamping-molded in two steps: being held for 30 seconds under a pressure of 20 kg/cm² in the first step, and for 20 seconds under a pressure of 50 kg/cm² in the second step, while the surface temperature was 160° C., whereby the grips of telephone receiver were prepared.

Further, electrolytic copper foil (thickness: 35 microns), film of Mixture (IV) (thickness: 100 microns), sheet of modified PPO (thickness: 3 mm), film of Mixture (IV) (thickness: 100 microns) and electrolytic copper foil (thickness: 35 microns) were laminated (cross-linked) while being held for 30 seconds at 250° C. under a pressure of 20 kg/cm, as shown in FIG. 14, whereby a laminated product was prepared.

The printed circuit board was stamping-molded in the same manner as above, except that the surface temperature was 170° C. In the laminated products thus obtained, through holes of 0.5 mm and 0.1 mm diameter were bored, and the through hole portions were plated using the chemical plating solution as in Example 34 to thereby form plated copper coating having a thickness of about 5 microns (Example 41).

With respect to the molded products obtained in Examples 1 to 14, 29 to 35, 38 to 41 and Comparative Examples 1, 2, 5, 7 to 9 the peeling strength was measured. The results are shown in Table 6. The boundary surface peeling off is also shown in Table 6, in which "metal" means conductive metal layer (copper foil, etc.), "film" means the films of Mixtures (I) through (IV), EAA, and Saponified Product, and "resin" means the thermoplastic resins or thermoplastic resins composition containing inorganic fillers to be injection molded.

TABLE 6

| Example No. | Peeling strength (kg/cm) | Peeling surface | No. of figure corresponding |
|---|---|---|---|
| Example 1 | 3.2 | Film/Resin | 2 |
| Example 2 | 2.8 | " | " |
| Example 3 | 2.8 | " | " |
| Example 4 | 3.1 | " | " |
| Example 5 | 2.5 | " | " |
| Example 6 | 3.8 | Metal/Film | " |
| Example 7 | 4.2 | " | " |
| Example 8 | 3.5 | Film/Resin | " |
| Example 9 | 2.8 | " | " |
| Example 10 | 2.6 | " | " |
| Example 11 | 2.4 | " | " |
| Example 12 | 3.4 | " | " |
| Example 13 | 3.5 | " | " |
| Example 14 | 2.8 | " | " |
| Example 29 | 3.4 | " | 4 |
| Example 30 | 3.5 | " | " |
| Example 31 | 2.8 | " | 3 |
| Example 32 | 2.5 | " | " |
| Example 33 | 2.7 | " | " |
| Example 34 | 2.7 | " | 5 |
| Example 35 | 2.8 | " | " |
| Example 38 | 2.6 | Metal/Film | 5 |
| Example 39 | 3.3 | Film/Resin | 11 |
| Example 40 | 2.5 | " | 13 |
| Example 41 | 2.7 | " | 14 |
| Comparative Example 1 | 0.2 | " | 2 |
| Comparative Example 2 | 0.1 | Metal/Resin | " |
| Comparative Example 5 | 0 | " | 5 |
| Comparative Example 7 | 0.1 | " | " |
| Comparative Example 8 | 0.1 | " | " |
| Comparative Example 9 | 0 | Epoxy resin/ Resin | 2 |

Also, with respect to the molded products obtained in Examples 15 to 28, 36 and 37 and Comparative Examples 3, 4 and 6, the peeling strength was measured. The results are shown in Table 7. The peeling occurred between the resin layer and the printed circuit board.

TABLE 7

| Example or Comparative example No. | Peeling strength (kg/cm) |
|---|---|
| Example 15 | 3.2 |
| Example 16 | 2.7 |
| Example 17 | 2.8 |
| Example 18 | 3.0 |
| Example 19 | 2.5 |
| Example 20 | 3.5 |
| Example 21 | 3.5 |
| Example 22 | 3.2 |
| Example 23 | 2.4 |
| Example 24 | 2.5 |
| Example 25 | 2.2 |
| Example 26 | 2.2 |

TABLE 7-continued

| Example or Comparative example No. | Peeling strength (kg/cm) |
| --- | --- |
| Example 27 | 3.4 |
| Example 28 | 3.2 |
| Example 36 | 3.0 |
| Example 37 | 3.0 |
| Comparative Example 3 | 0.6 |
| Comparative Example 4 | 0.4 |
| Comparative Example 6 | 0.5 |

Further, in order to test the heat resistance in soldering of the molded product, the circuit portion of the laminated part was immersed for 5 seconds in solder at 260° C., and the heat resistance of the adhesive layer was observed by the naked eye. In all Examples, peeling, cracking, breaking, or other deformation could not be detected either between layers of the resin layer and the printed circuit board or between the printed circuit board and the copper circuit. These results indicate that the adhesive layer has satisfactory heat resistance. On the other hand, in the molded product obtained in each Comparative Example, melting was recognized in the printed circuit board and the copper circuit was peeled apart from the board.

The foregoing results of the Examples and Comparative Examples indicate that since a circuit can formed as an integral part of the molded product on the inside surface of the molded product in this invention, not only can extremely compact machinery or apparatus be designed, but also there are a number of advantages such that because of excellent heat resistance soldering can be made directly on the circuit; the circuit does not peel off from the machinery or apparatus by shock or the like, three-dimensional wiring can be made by laminating either by insertion-molding or by heating under pressure, and on account of the fact that the wiring is not in hanged or suspended state within the machinery and apparatus there is no danger of causing an accident such as short-circuit.

While the invention has been described in detail and with reference to specific embodiments thereof, it will be apparent to one skilled in the art that various changes and modifications can be made therein without departing from the spirit and scope thereof.

What is claimed is:

1. A molded product comprising a layer of a thermoplastic resin or a composition containing a thermoplastic resin having laminated thereon a printed circuit board which comprises a conductive metal layer and a thin-wall body having a thickness of 3 μm to 5 mm and containing in the thin wall body a crosslinked product, formed by heating a mixture of (A) and (B) below:
   (A) 1 to 99 wt % of an ethylenic copolymer which is derived from 30 to 99.5 wt % of ethylene unit, and at least one monomer unit (a) selected from the group consisting of monocarboxylic acid unit, dicarboxylic acid unit, acid anhydride unit thereof and half ester unit thereof; and
   (B) 99 to 1 wt % of an ethylenic copolymer which is derived from 30 to 99.5 wt % of ethylene unit, and at least one monomer unit (b) selected from the group consisting of monomer units containing a hydroxyl group, an amino group or an oxirane unit.

2. A molded product as in claim 1, wherein the product further comprises a layer of the ethylenic copolymer (A) or (B) interposed between the layer of thermoplastic resin and the thin wall body.

3. A molded product as in claim 1, wherein the total content of the monomer unit (a) in the ethylenic copolymer (A) is 0.1 to 70 wt % and the total content of monomer unit (b) in the ethylenic copolymer (B) is 0.1 to 70 wt %.

4. A molded product as in claim 2, wherein the total content of the monomer unit (a) in the ethylenic copolymer (A) is 0.1 to 70 wt % and the total content of monomer unit (b) in the ethylenic copolymer (B) is 0.1 to 70 wt %.

5. A molded product as in claim 1, wherein the ethylenic copolymer (A) is (i) a copolymer of ethylene and at least one monomer (a) selected from the group consisting of unsaturated monocarboxylic acids having containing up to 25 carbon atoms, unsaturated dicarboxylic acids containing 4 to 50 carbon atoms and anhydrides of the unsaturated dicarboxylic acids; (ii) a copolymer of ethylene, the monomer (a) and a monomer selected from the grup consisting of unsaturated carboxylic acid ester containing up to 30 carbon atoms and vinyl esters containing up to 30 carbon atoms; or (iii) products obtained by hydrolysis or alcohol modification of the copolymer (i) or (ii) having the acid anhydride group.

6. A molded product as in claim 2, wherein the ethylenic copolymer (a) is (i) a copolymer of ethylene and at least one monomer (A) selected from the group consisting of unsaturated monocarboxylic acids having containing up to 25 carbon atoms, unsaturated dicarboxylic acids containing 4 to 50 carbon atoms and anhydrides of the unsaturated dicarboxylic acids; (ii) a copolymer of ethylene, the monomer (a) and a monomer selected from the group consisting of unsaturated carboxylic acid ester containing up to 30 carbon atoms and vinyl esters containing up to 30 carbon atoms; or (iii) products obtained by hydrolysis or alcohol modification of the copolymer (i) or (ii) having the acid anhydride group.

7. A molded product as in claim 1, wherein the ethylenic copolymer (B) is (iv) a copolymer of ethylene and at least one monomer (b) selected from the group consisting of hydroxyalkyl (meth)acrylates having the alkyl moiety of up to 30 carbon atoms, α-alkenylalcohols having up to 30 carbon atoms, α-alkenylamines having up to 30 carbon atoms, primary or secondary aminoalkyl (meth)acrylates having the alkyl moiety of up to 30 carbon atoms and oxirane ring-containing compounds represented by formulae (I) to (III)

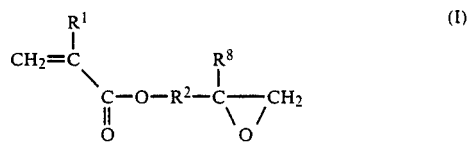

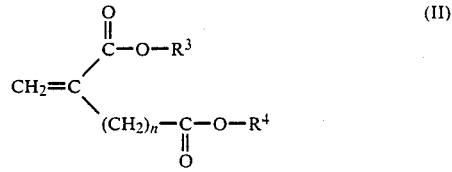

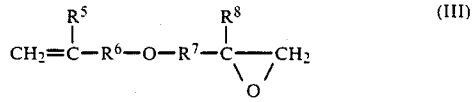

wherein R¹, R⁵ and R⁸ which may be the same or different, each represents a hydrogen atom or a methyl group, R², R⁶ and R⁷ which may also be the same or different, each represents a straight chain or branched chain alkylene group having 1 to 12 carbon atoms, R³ and R⁴ each represents a straight chain or branched chain alkyl group having up to 12 carbon atoms and a straight chain or branched chain alkyl group having 2 to 12 carbon atoms and having an oxirane group at the terminal, provided that at least one of R³ and R⁴ has the alkyl group having an oxirane group, and n is 0 or 1; (v) a copolymer of ethylene, the monomer (b) and a monomer selected from the group consisting of unsaturated carboxylic acid esters containing up to 30 carbon atoms and vinyl esters containing up to 30 carbon atoms; or (vi) saponification products of a copolymer of ethylene and a vinyl ester.

8. A molded product as in claim 2, wherein the ethylenic copolymer (B) is (iv) a copolymer of ethylene and at least one monomer (b) selected from the group consisting of hydroxyalkyl (meth) acrylates having the alkyl moiety of up to 30 carbon atoms, α-alkenylalcohols having up to 30 carbon atoms, α-alkenylamines having up to 30 carbon atoms, primary or secondary aminoalkyl (meth)acrylates having the alkyl moiety of up to 30 carbon atoms and oxirane ring-containing compounds represented by formulae (i) to (III)

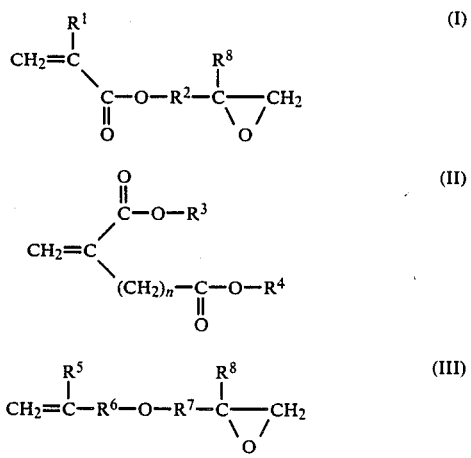

wherein R¹, R⁵ and R⁸ which may be the same or different, each represents a hydrogen atom or a methyl group, R², R⁶ and R⁷ which may also be the same or different, each represents a straight chain or branched chain alkylene group having 1 to 12 carbon atoms, R³ and R⁴ each represents a straight chain or branched chain alkyl group having up to 12 carbon atoms and a straight chain or branched chain alkyl group having 2 to 12 carbon atoms and having an oxirane group at the terminal, provided that at least one of R³ and R⁴ has the alkyl group having an oxirane group, and n is 0 or 1; a copolymer of ethylene, the monomer (b) and a monomer selected from the group consisting of unsaturated carboxylic acid esters containing up to 30 carbon atoms and vinyl esters containing up to 30 carbon atoms; or (vi) saponification products of a copolymer of ethylene and a vinyl ester.

9. A molded product as in claim 1, wherein the monomer unit (b) contains a oxirane unit.

10. A molded product as in claim 2, wherein the monomer unit (b) contains a oxirane unit.

11. A molded product as in claim 7, wherein the monomer (b) is selected from the oxirane ring containing compounds.

12. A molded product as in claim 8, wherein the monomer (b) is selected from the oxirane ring containing compounds.

13. A molded product as in claim 1, wherein the mixing ratio of the ethylenic copolymer (A) to the ethylenic copolymer (B) is from 10/90 to 90/10 by weight.

14. A molded product as in claim 2, wherein the mixing ratio of the ethylenic copolymer (A) to the ethylenic copolymer (B) is from 10/90 to 90/10 by weight.

15. A molded product as in claim 1, wherein said composition containing a thermoplastic resin comprises a mixture of a thermoplastic resin and an inorganic filler.

16. A molded product as in claim 15, wherein the amount of the inorganic filler in said composition is 80% by weight or less.

17. A molded product as in claim 1, wherein said crosslinked product is crosslinked to the extent of having an extraction residue of 60% or more.

18. A molded product as in claim 17, wherein said extraction residue is 75% or more.

19. A molded product as in claim 1, wherein said thin-wall body consists essentially of said crosslinked product.

* * * * *